US011315971B2

(12) United States Patent
Ono et al.

(10) Patent No.: US 11,315,971 B2
(45) Date of Patent: Apr. 26, 2022

(54) IMAGING DEVICE, METHOD OF PRODUCING IMAGING DEVICE, IMAGING APPARATUS, AND ELECTRONIC APPARATUS

(71) Applicant: SONY SEMICONDUCTOR SOLUTIONS CORPORATION, Kanagawa (JP)

(72) Inventors: Shogo Ono, Kanagawa (JP); Masahiko Shimizu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 47 days.

(21) Appl. No.: 16/643,959

(22) PCT Filed: Aug. 29, 2018

(86) PCT No.: PCT/JP2018/031870
§ 371 (c)(1),
(2) Date: Mar. 3, 2020

(87) PCT Pub. No.: WO2019/054177
PCT Pub. Date: Mar. 21, 2019

(65) Prior Publication Data
US 2020/0203409 A1    Jun. 25, 2020

(30) Foreign Application Priority Data
Sep. 12, 2017 (JP) .............................. JP2017-174899

(51) Int. Cl.
*H01L 27/146* (2006.01)
*H04N 5/225* (2006.01)

(52) U.S. Cl.
CPC .... *H01L 27/14618* (2013.01); *H01L 27/1462* (2013.01); *H01L 27/14685* (2013.01); *H04N 5/2254* (2013.01)

(58) Field of Classification Search
CPC .......... H01L 27/14618; H01L 27/1462; H01L 27/14685; H01L 27/14625;
(Continued)

(56) References Cited

U.S. PATENT DOCUMENTS 4,971,930 A * 11/1990 Fusaroli ................. G11C 16/18
264/272.17
5,949,655 A * 9/1999 Glenn .................... H01L 23/04
361/783
(Continued)

FOREIGN PATENT DOCUMENTS

CN       1728396 A    2/2006
CN       1967854 A    5/2007
(Continued)

OTHER PUBLICATIONS

International Search Report and Written Opinion of PCT Application No. PCT/JP2018/031870, dated Nov. 6, 2018, 10 pages of ISRWO.

*Primary Examiner* — Jonathan Han
(74) *Attorney, Agent, or Firm* — Chip Law Group

(57) ABSTRACT

Provided are an imaging device that enables formation of a film over the entirety of a film formation region, a method of producing the imaging device, an imaging apparatus, and an electronic apparatus. The imaging device includes a sensor and a glass sheet bonded to a front surface of the sensor. The glass sheet includes a recess in a peripheral portion that is outside a film formation region over which an inorganic film is to be formed. The recess corresponds to a claw on a periphery of an opening of a tray for a vapor deposition process for the inorganic film. This allows the
(Continued)

entirety of the film formation region of the glass sheet to be exposed from the opening when the imaging device is set in the opening, and thus enables formation of the inorganic film over the entirety of the film formation region.

14 Claims, 22 Drawing Sheets

(58) Field of Classification Search
CPC ............ H01L 27/14636; H01L 27/146; H01L 31/0232; H04N 5/2254; H04N 5/335; H04N 5/369
See application file for complete search history.

(56) References Cited

U.S. PATENT DOCUMENTS

| | | | |
|---|---|---|---|
| 6,271,102 B1* | 8/2001 | Brouillette | B23D 59/002 |
| | | | 257/E21.518 |
| 2006/0023108 A1* | 2/2006 | Watanabe | H01L 27/14627 |
| | | | 348/335 |
| 2007/0126914 A1 | 6/2007 | Komatsu et al. | |
| 2007/0218586 A1 | 9/2007 | Yoshimura et al. | |
| 2010/0025710 A1* | 2/2010 | Yamada | H01L 27/14627 |
| | | | 257/98 |
| 2010/0181681 A1 | 7/2010 | Akiba et al. | |
| 2010/0207252 A1 | 8/2010 | Yoshimura et al. | |
| 2013/0062747 A1 | 3/2013 | Akiba et al. | |
| 2015/0085094 A1 | 3/2015 | Fujimori et al. | |

FOREIGN PATENT DOCUMENTS

| | | |
|---|---|---|
| CN | 101038891 A | 9/2007 |
| CN | 101789392 A | 7/2010 |
| CN | 103871993 A | 6/2014 |
| CN | 104364894 A | 2/2015 |
| EP | 2858105 A1 | 4/2015 |
| HK | 1194861 A | 7/2017 |
| JP | 2006-041183 A | 2/2006 |
| JP | 2007-142194 A | 6/2007 |
| JP | 2007-250886 A | 9/2007 |
| JP | 2010-171156 A | 8/2010 |
| JP | 2015-012474 A | 1/2015 |
| JP | 2015-018965 A | 1/2015 |
| JP | 2015-170638 A | 9/2015 |
| JP | 2017-103478 A | 6/2017 |
| JP | 2017-130610 A | 7/2017 |
| KR | 10-2006-0010686 A | 2/2006 |
| KR | 10-2007-0046041 A | 5/2007 |
| KR | 10-2007-0094495 A | 9/2007 |
| KR | 10-2010-0086436 A | 7/2010 |
| KR | 10-2015-0007944 A | 1/2015 |
| KR | 10-2016-0052484 A | 5/2016 |
| TW | 200605652 A | 2/2006 |
| TW | 200739755 A | 10/2007 |
| TW | 201507015 A | 2/2015 |
| WO | 2013/179766 A1 | 12/2013 |
| WO | 2017/126376 A1 | 7/2017 |

* cited by examiner

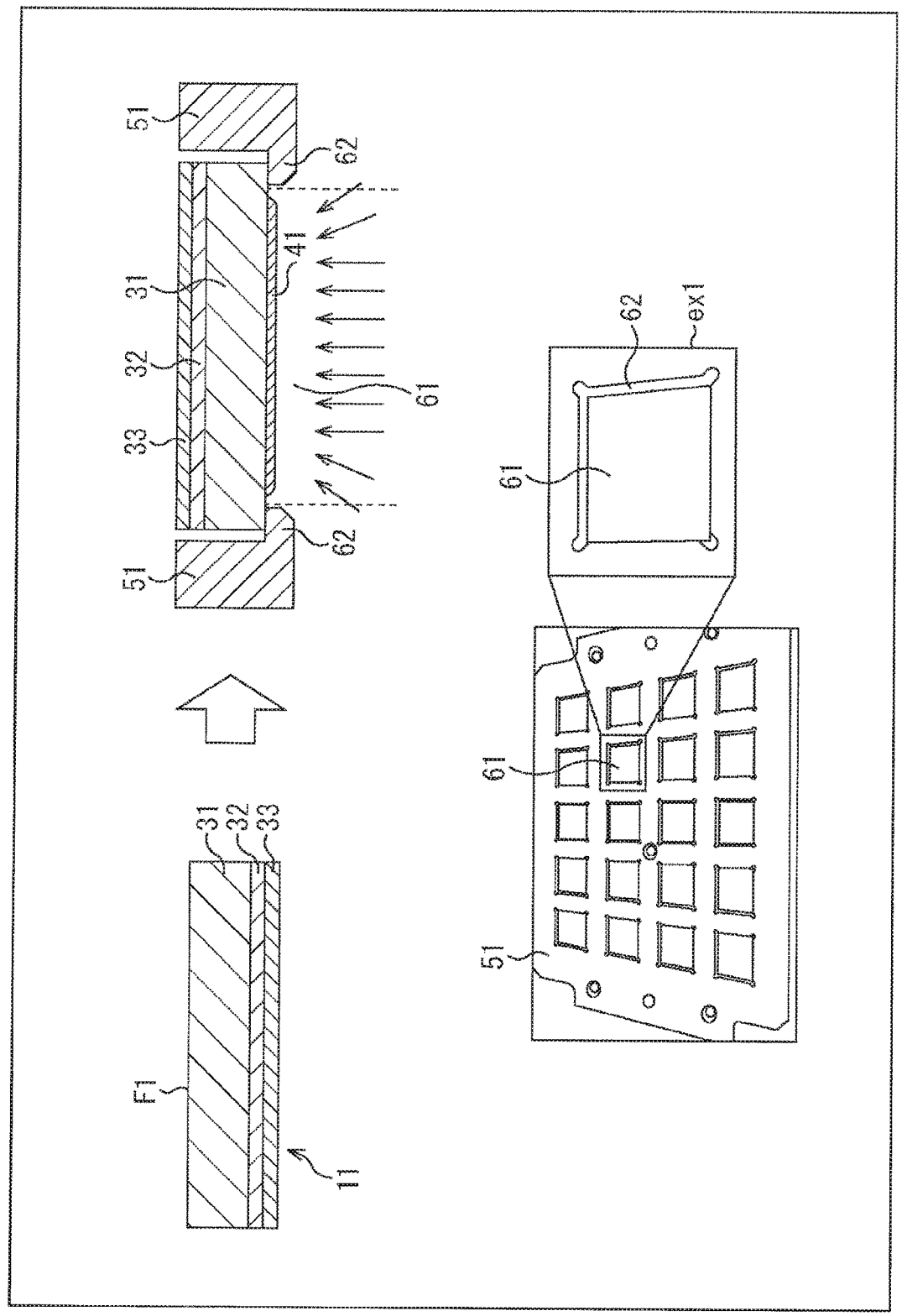
[FIG. 1]

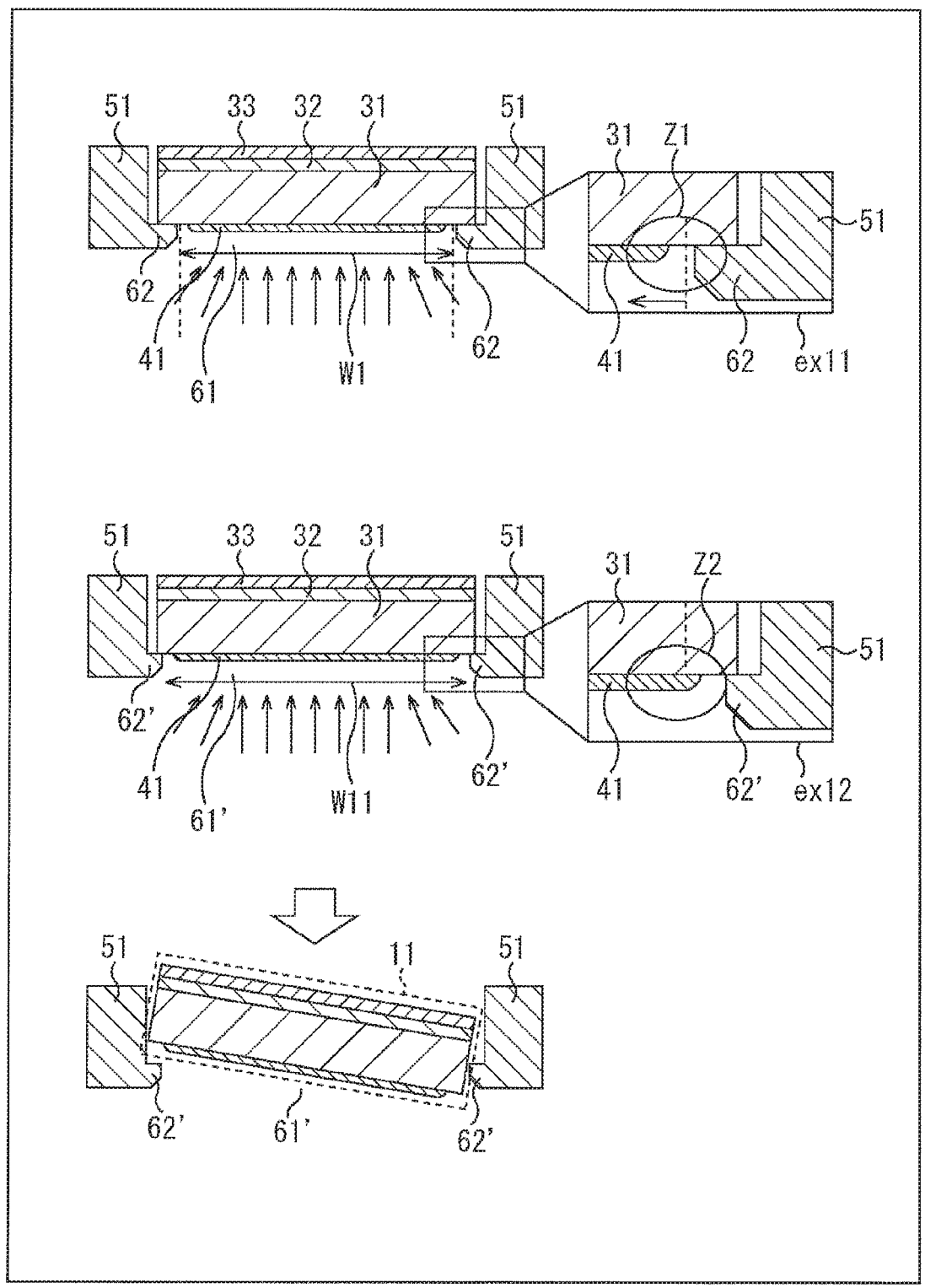
[FIG. 2]

[FIG. 3]
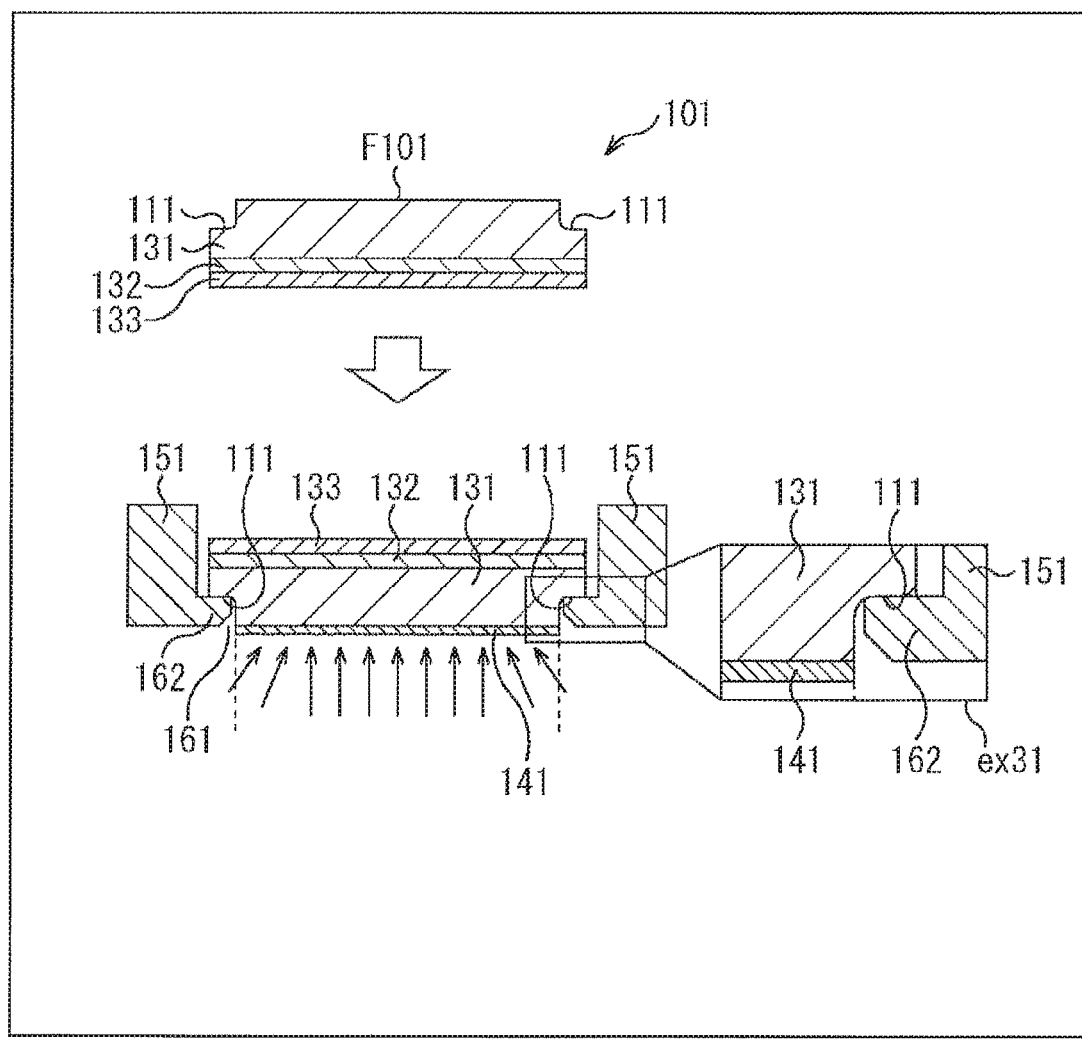

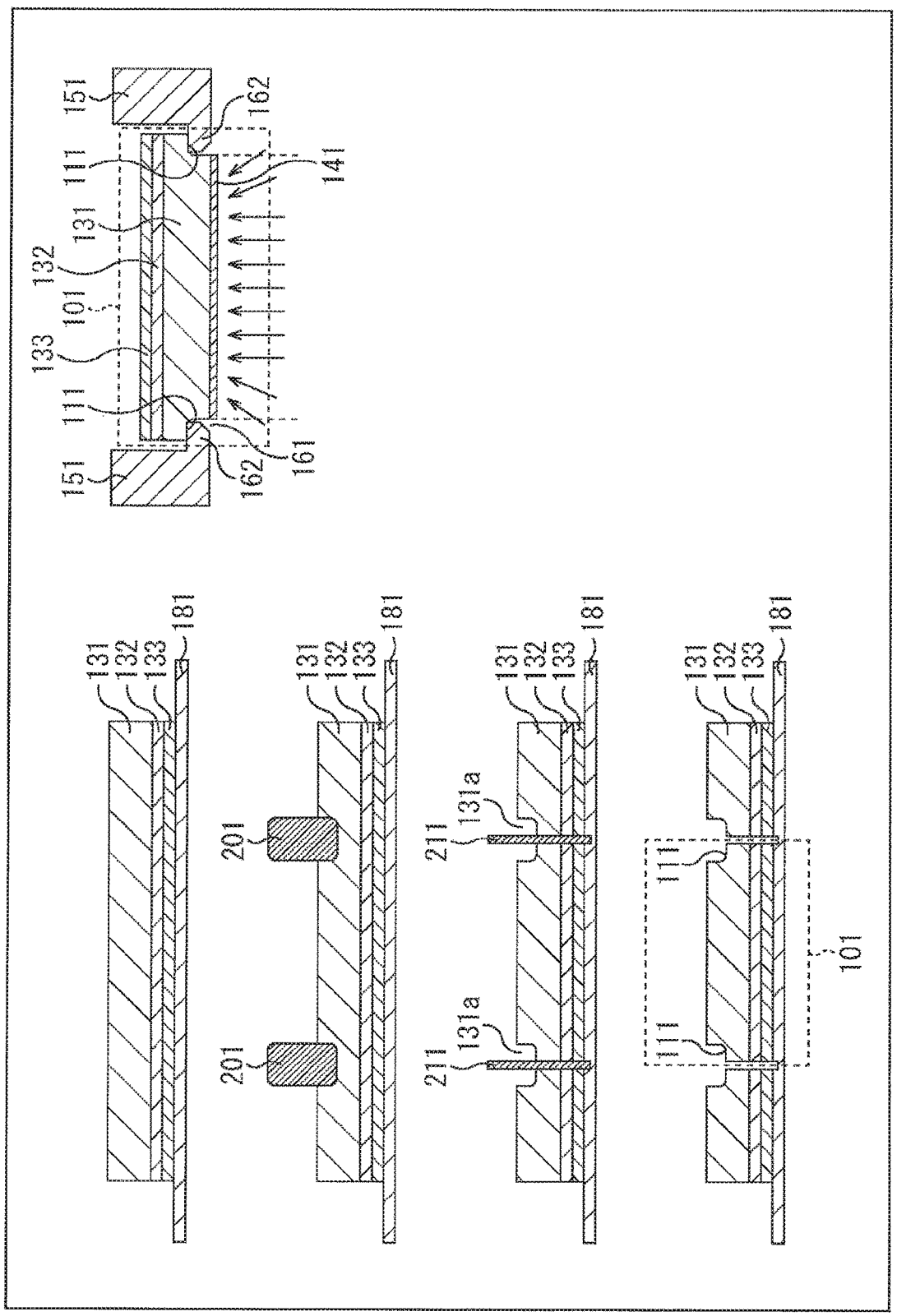
[FIG. 4]

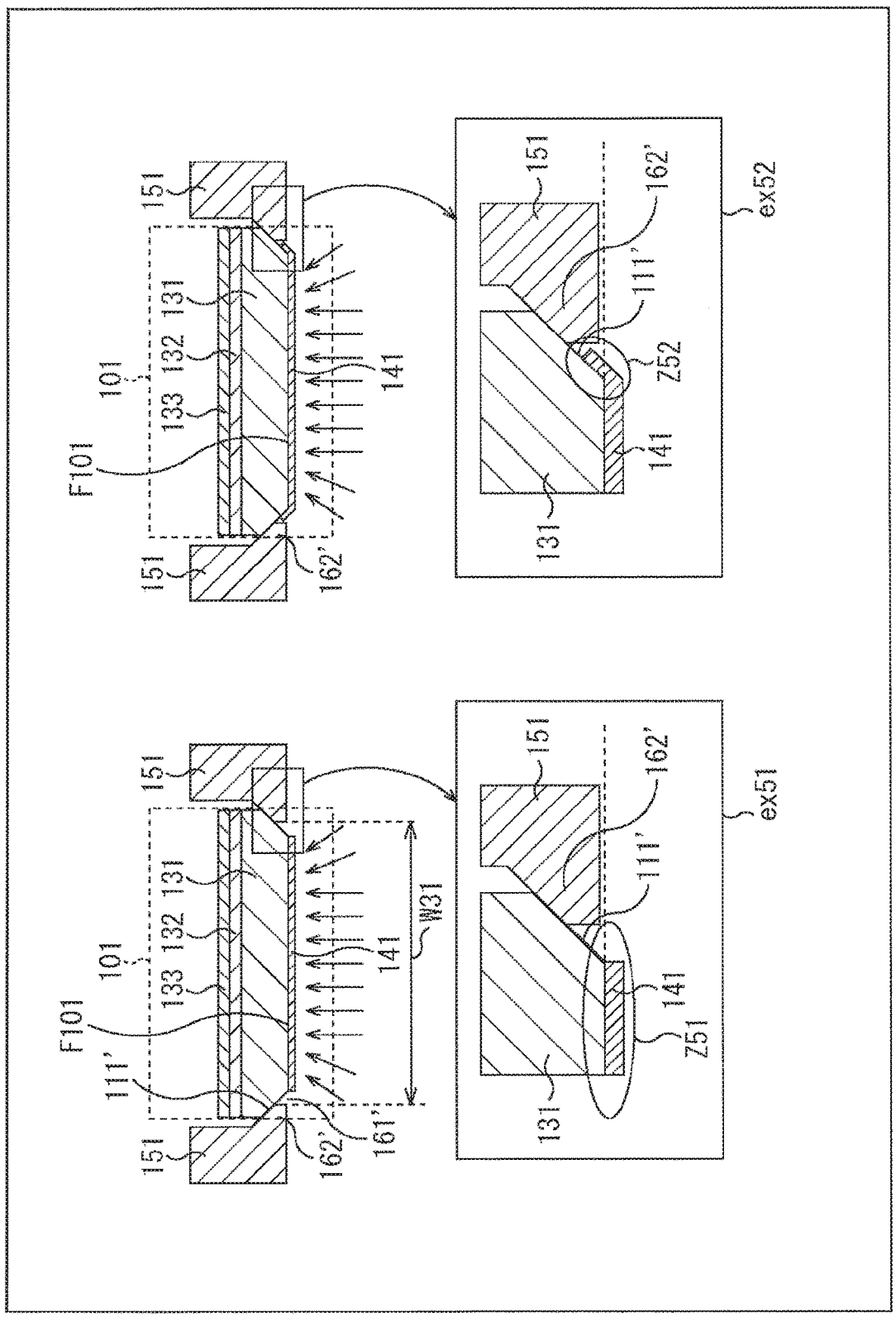

[FIG. 6]
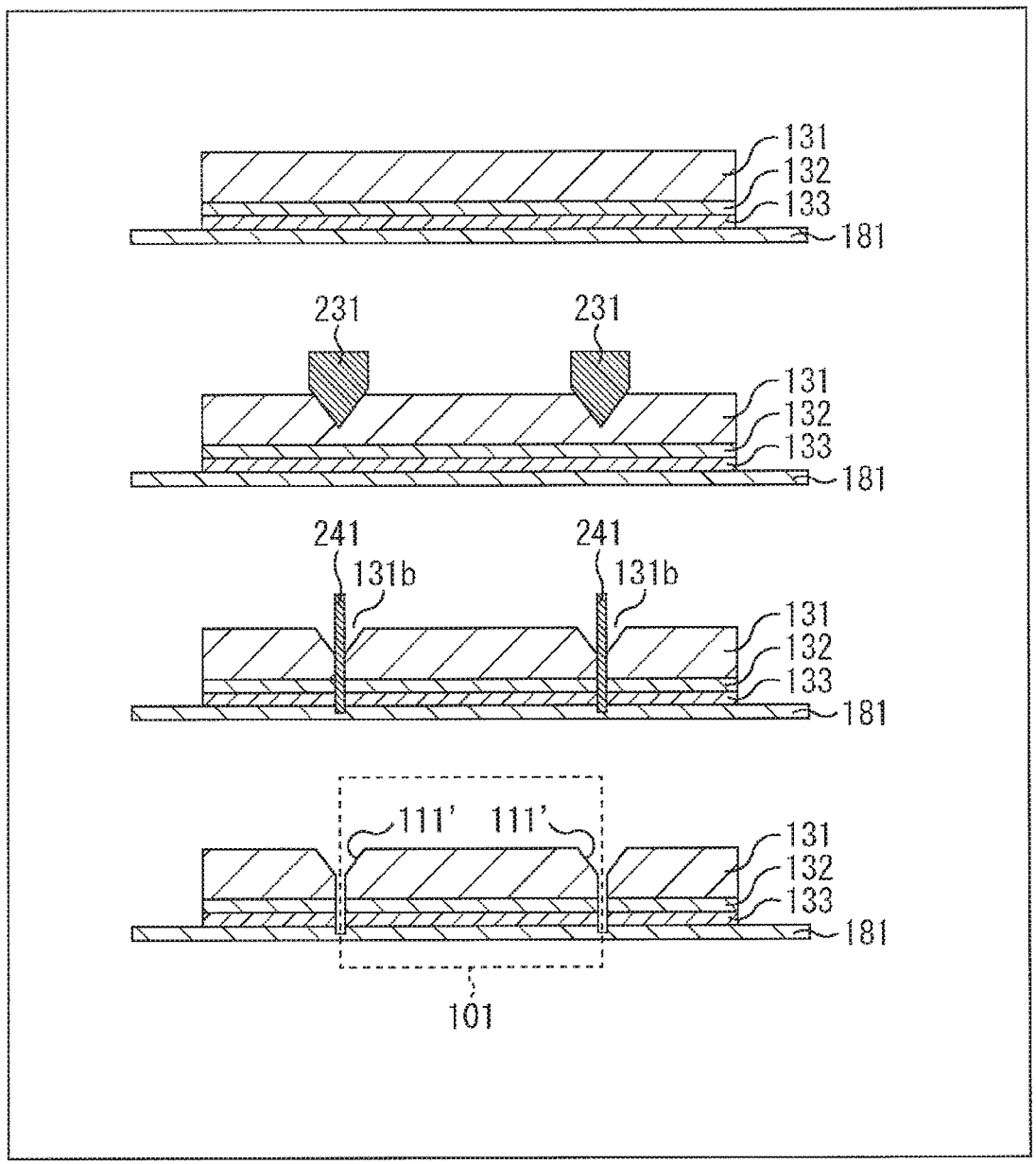

[FIG. 7]
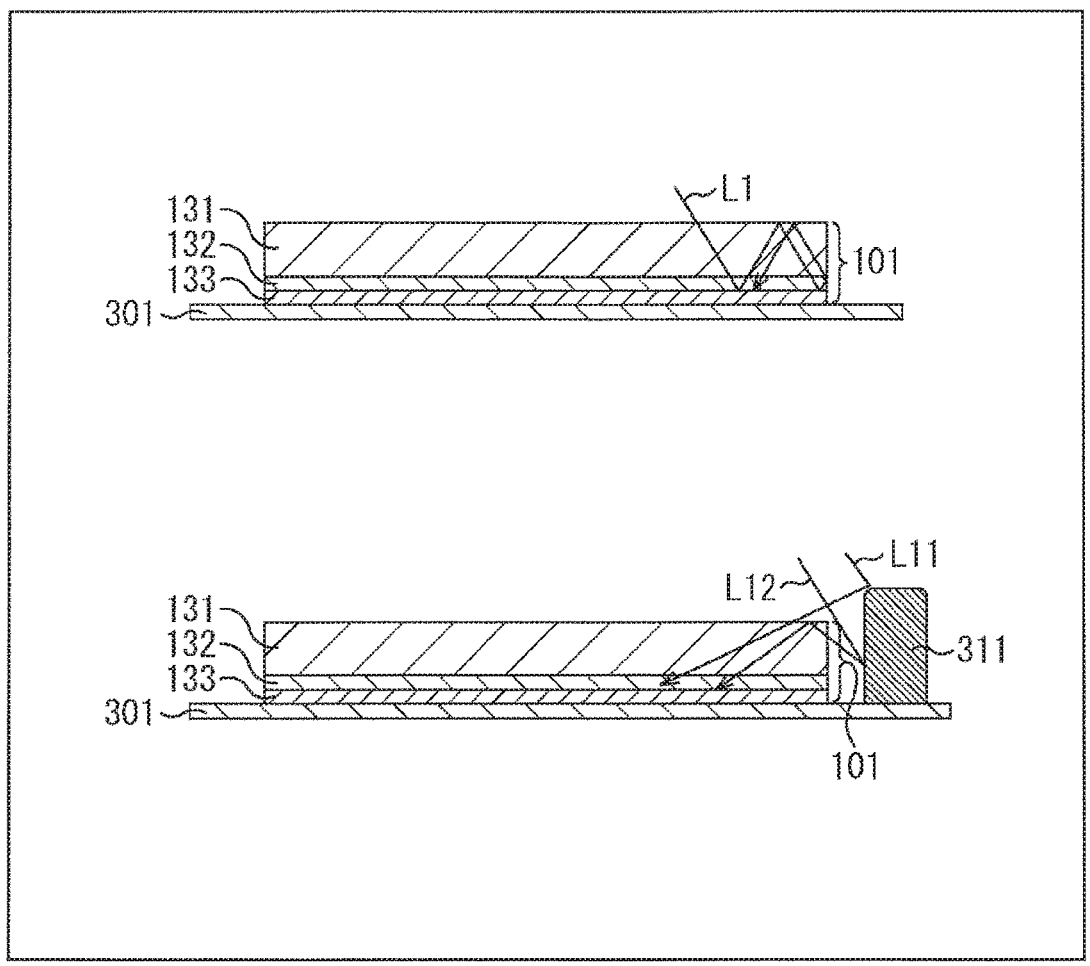

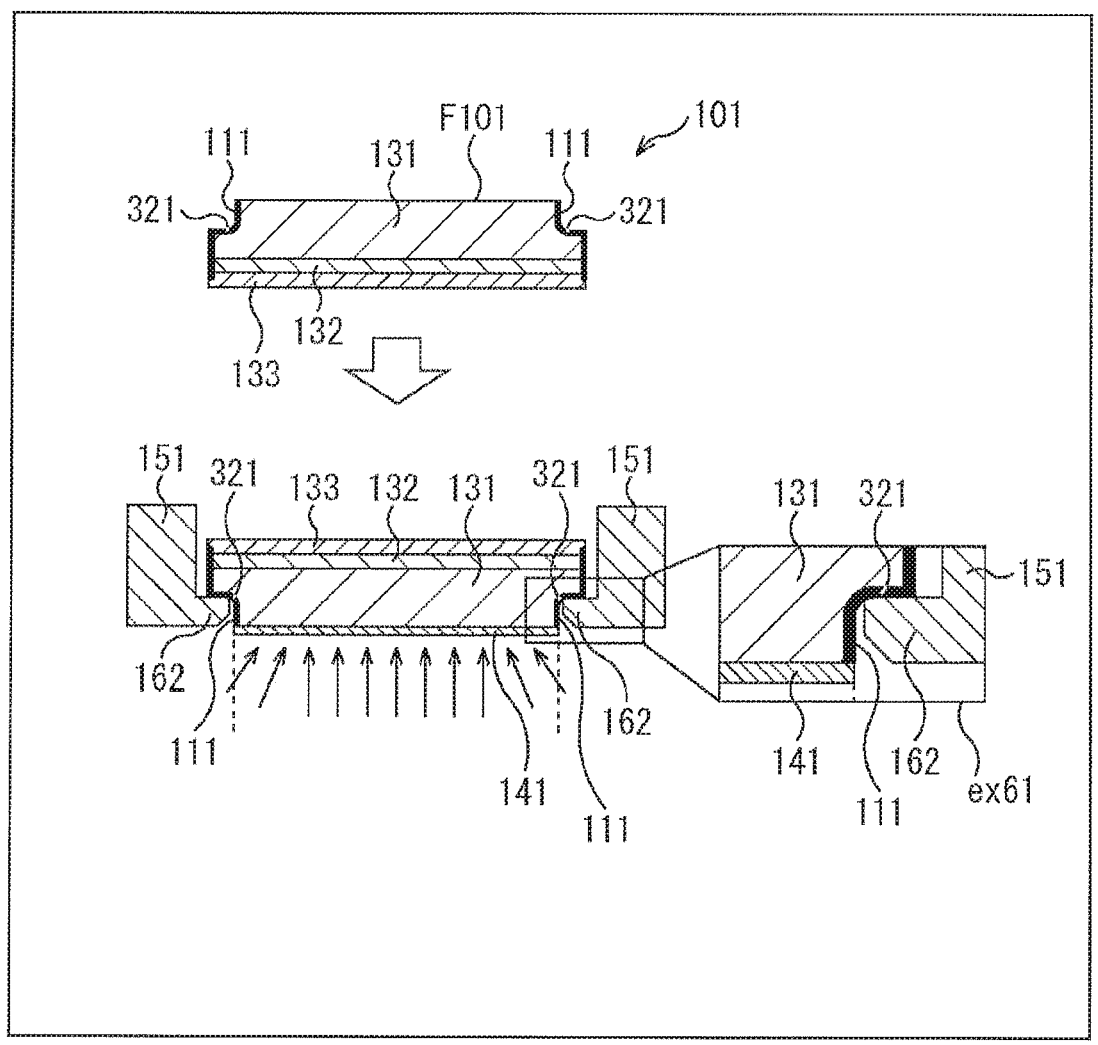
[FIG. 8]

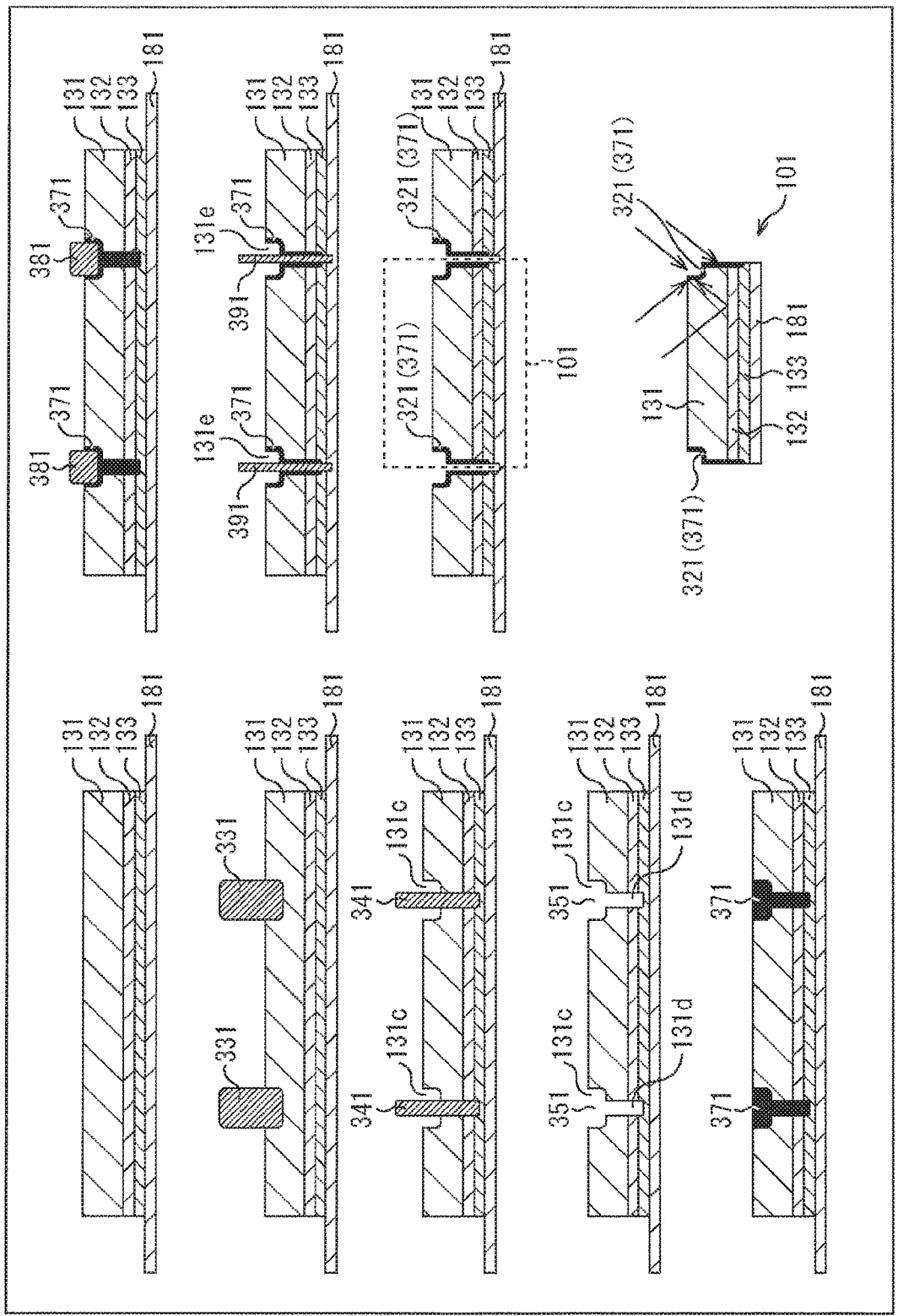
[FIG. 9]

[FIG. 10]
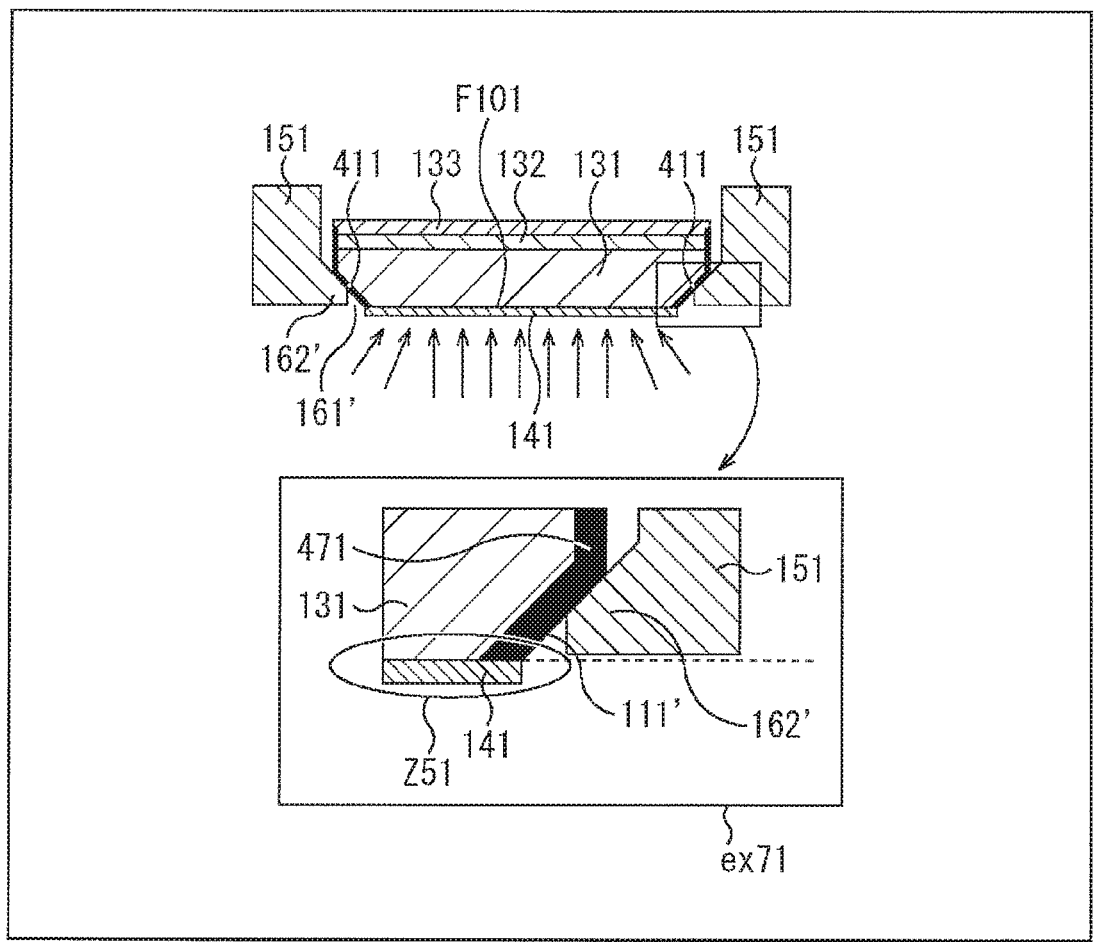

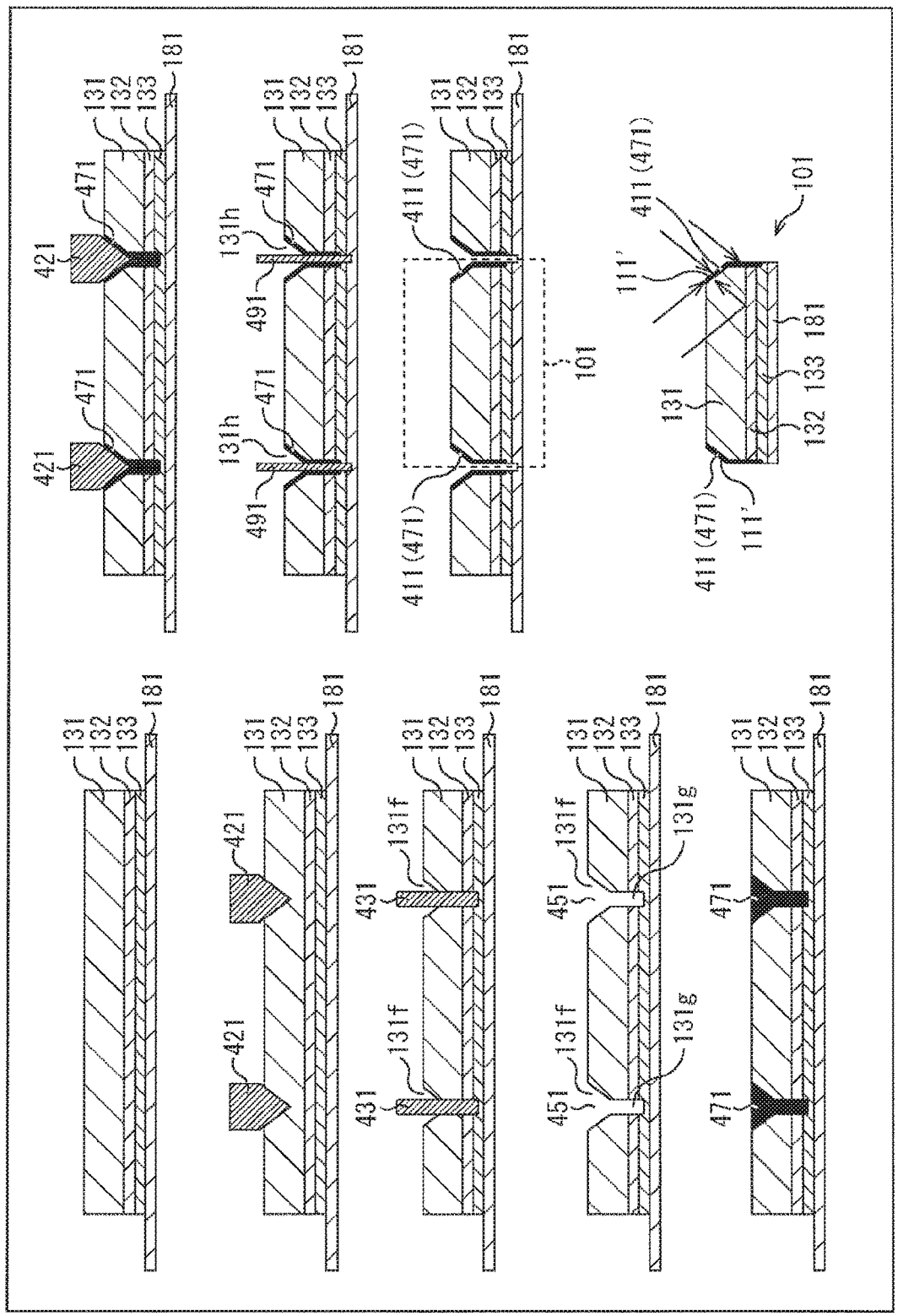
[FIG. 11]

[FIG. 12]
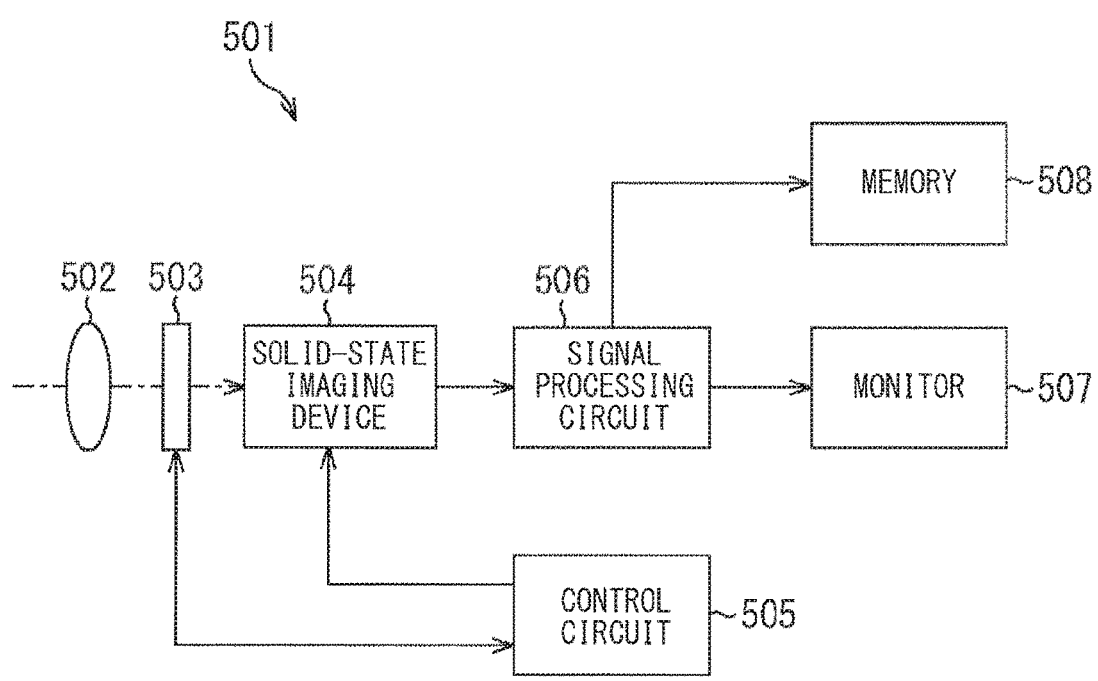

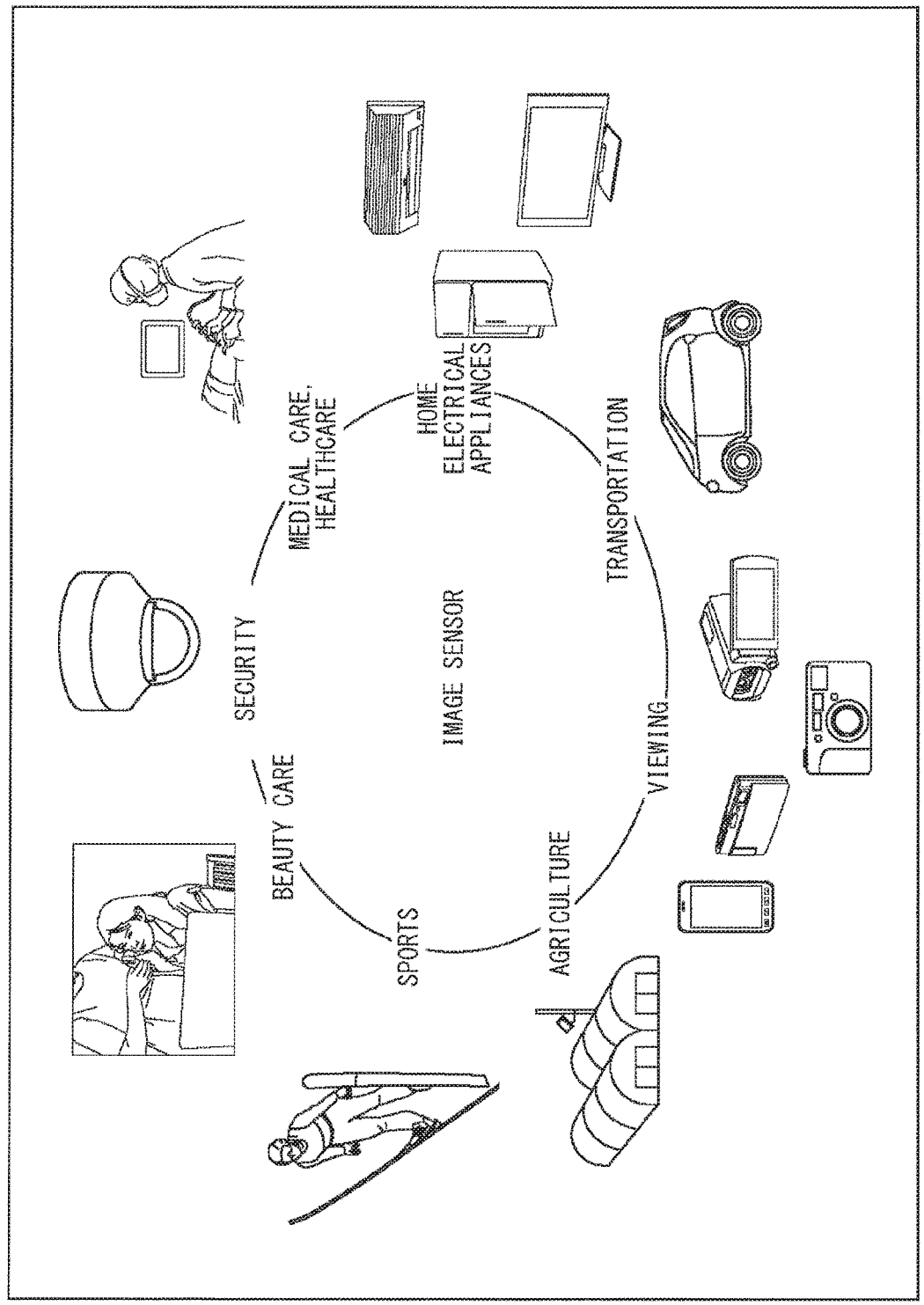
[FIG. 13]

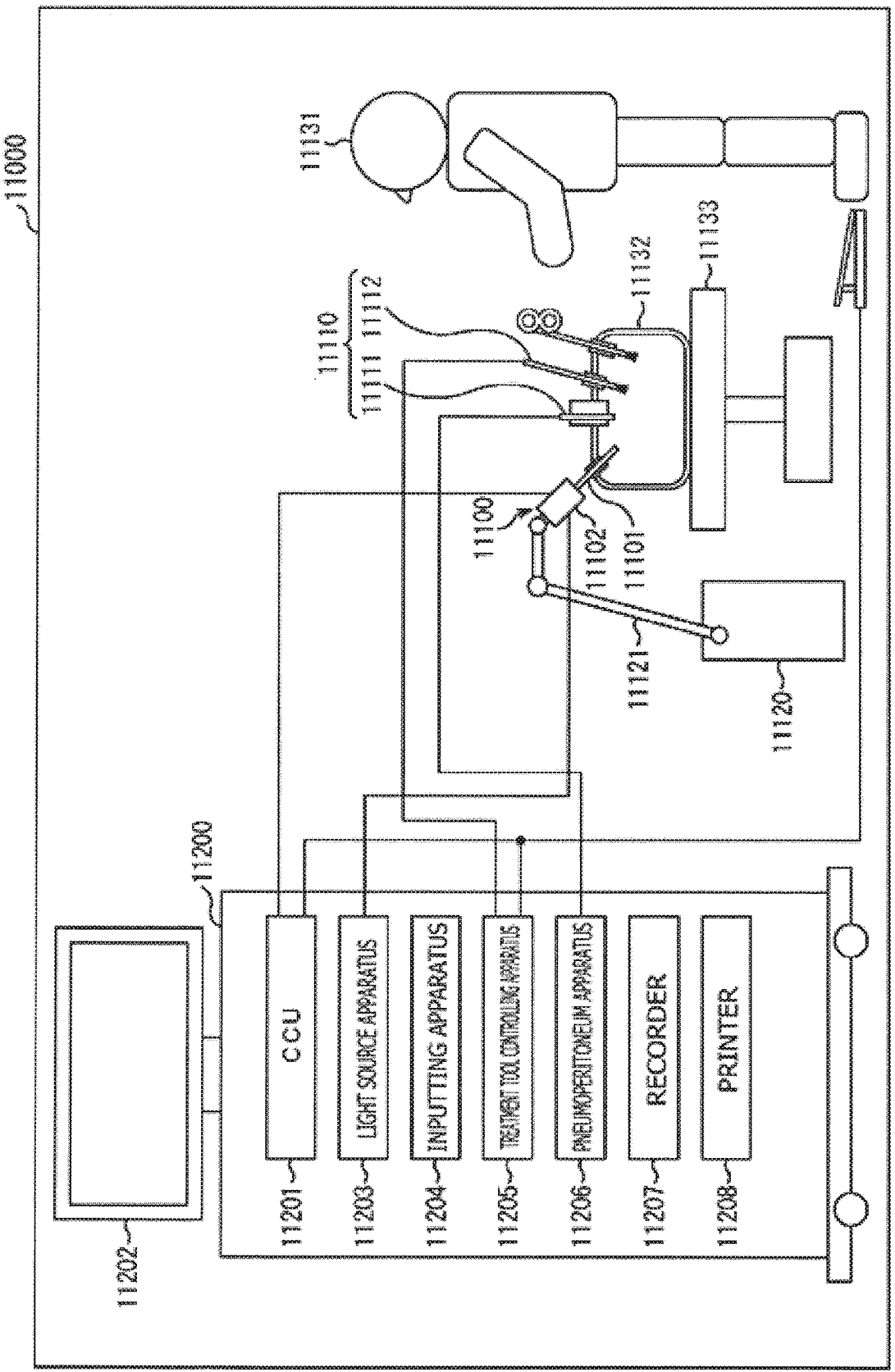
[FIG. 14]

[FIG. 15]
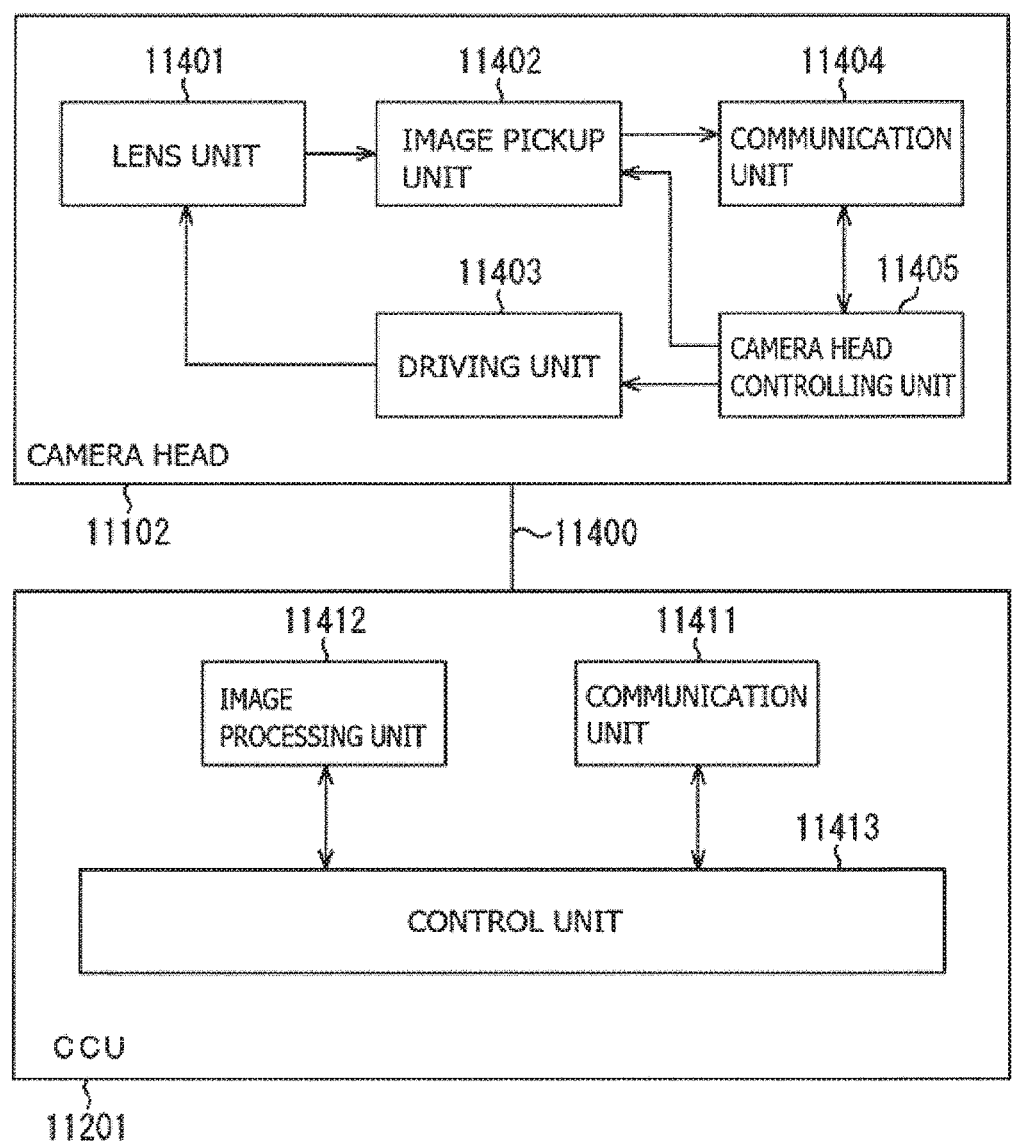

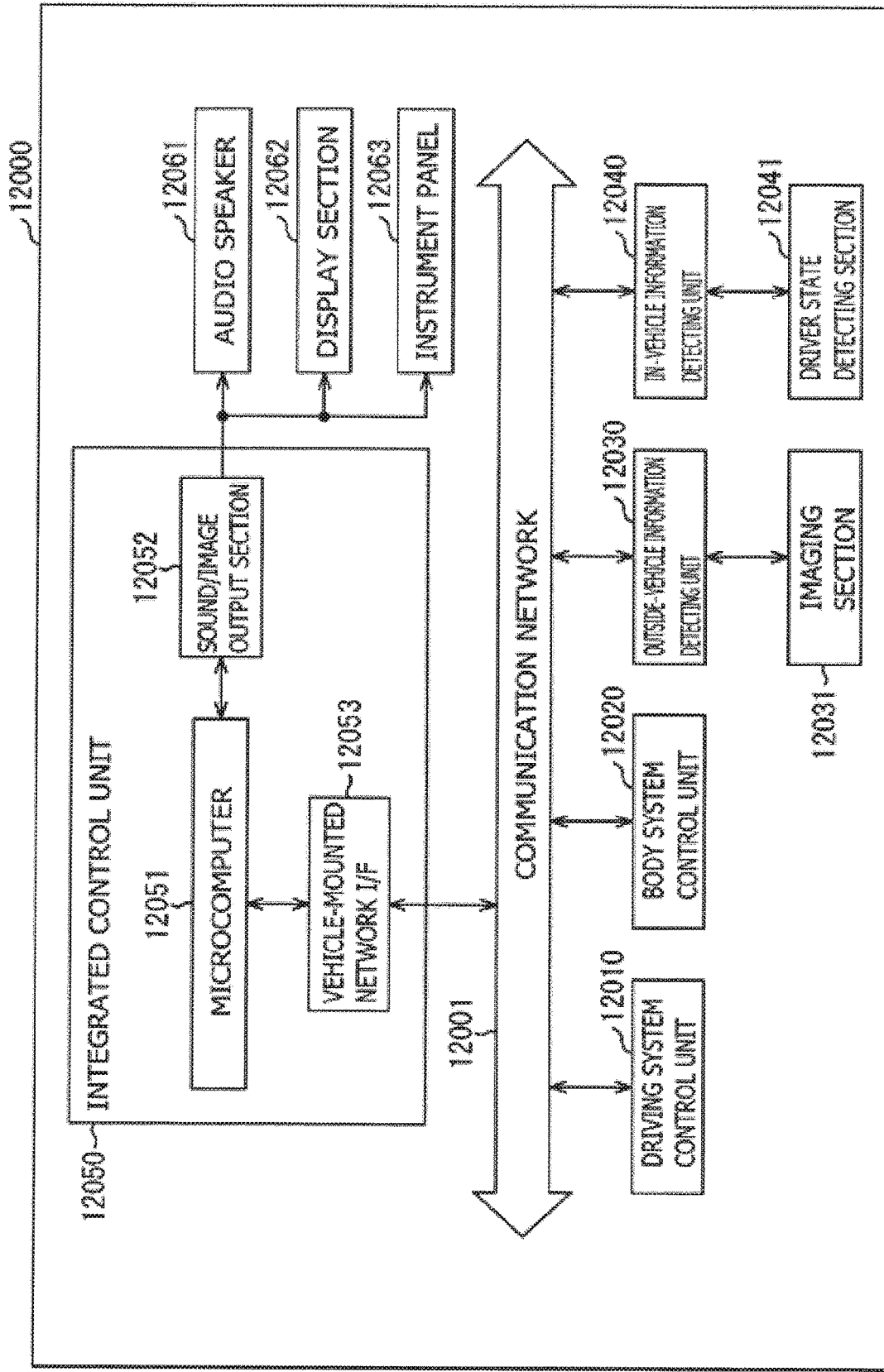
[FIG. 16]

[FIG. 17]
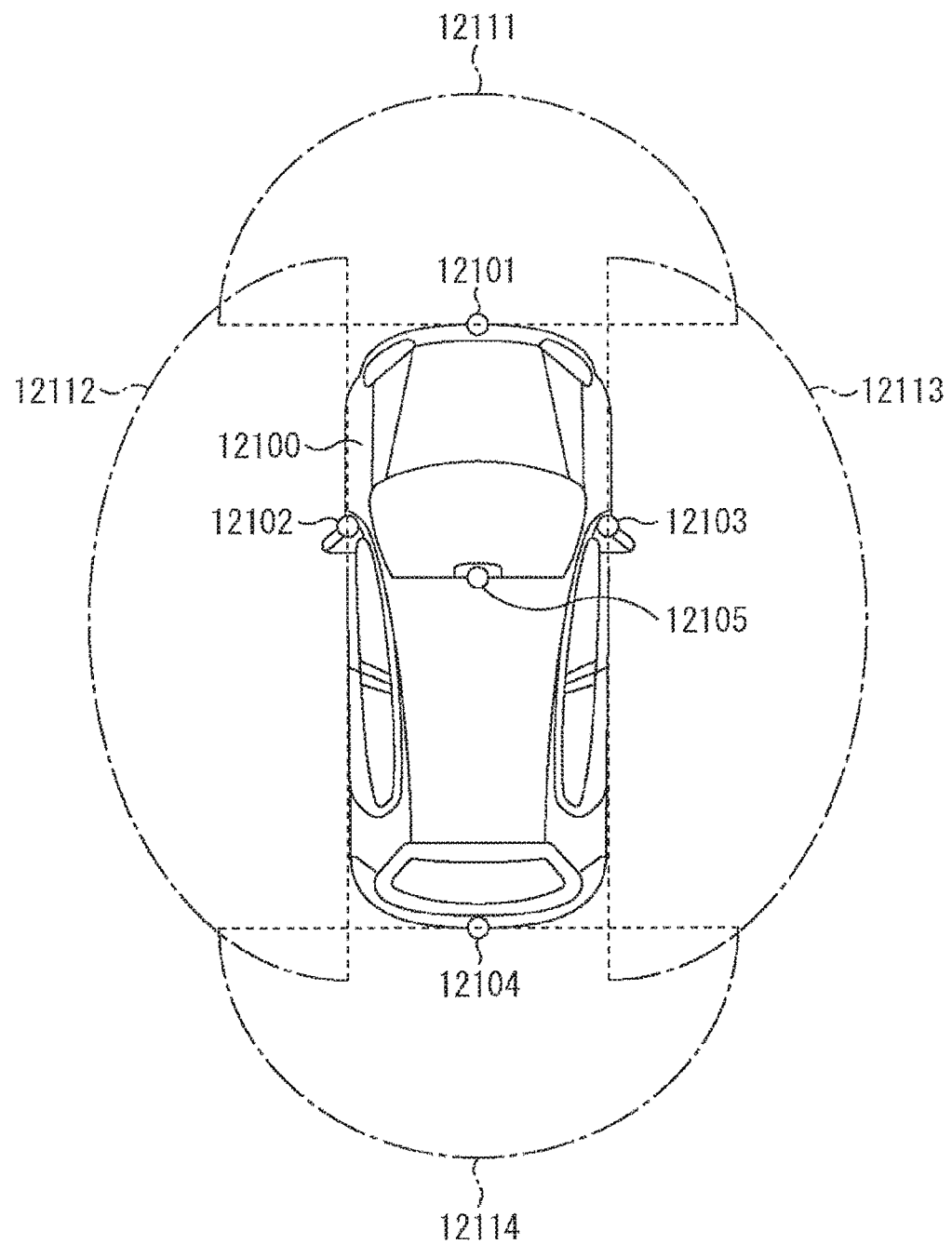

[FIG. 18A]
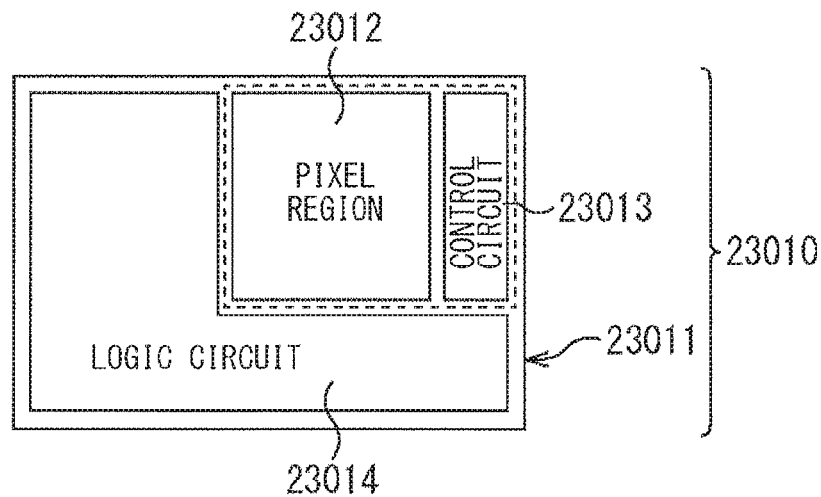
[FIG. 18B]
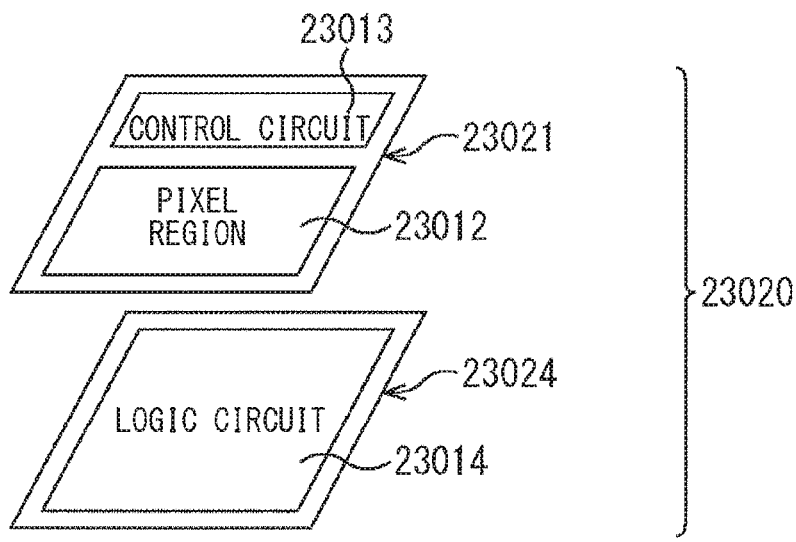
[FIG. 18C]
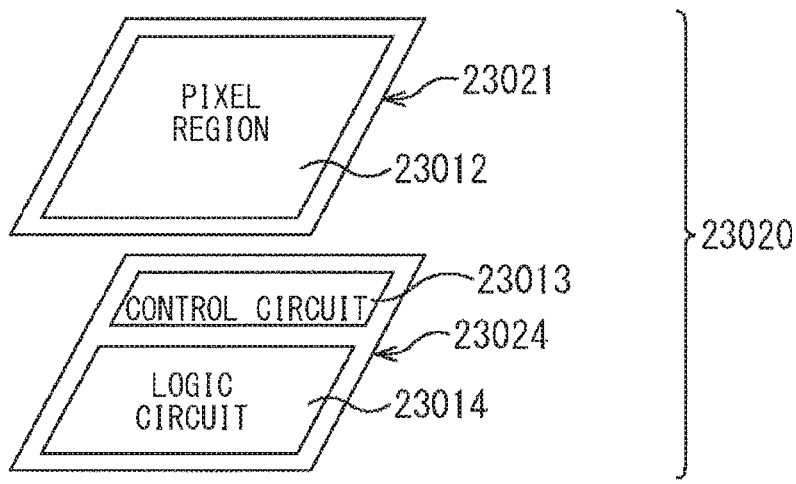

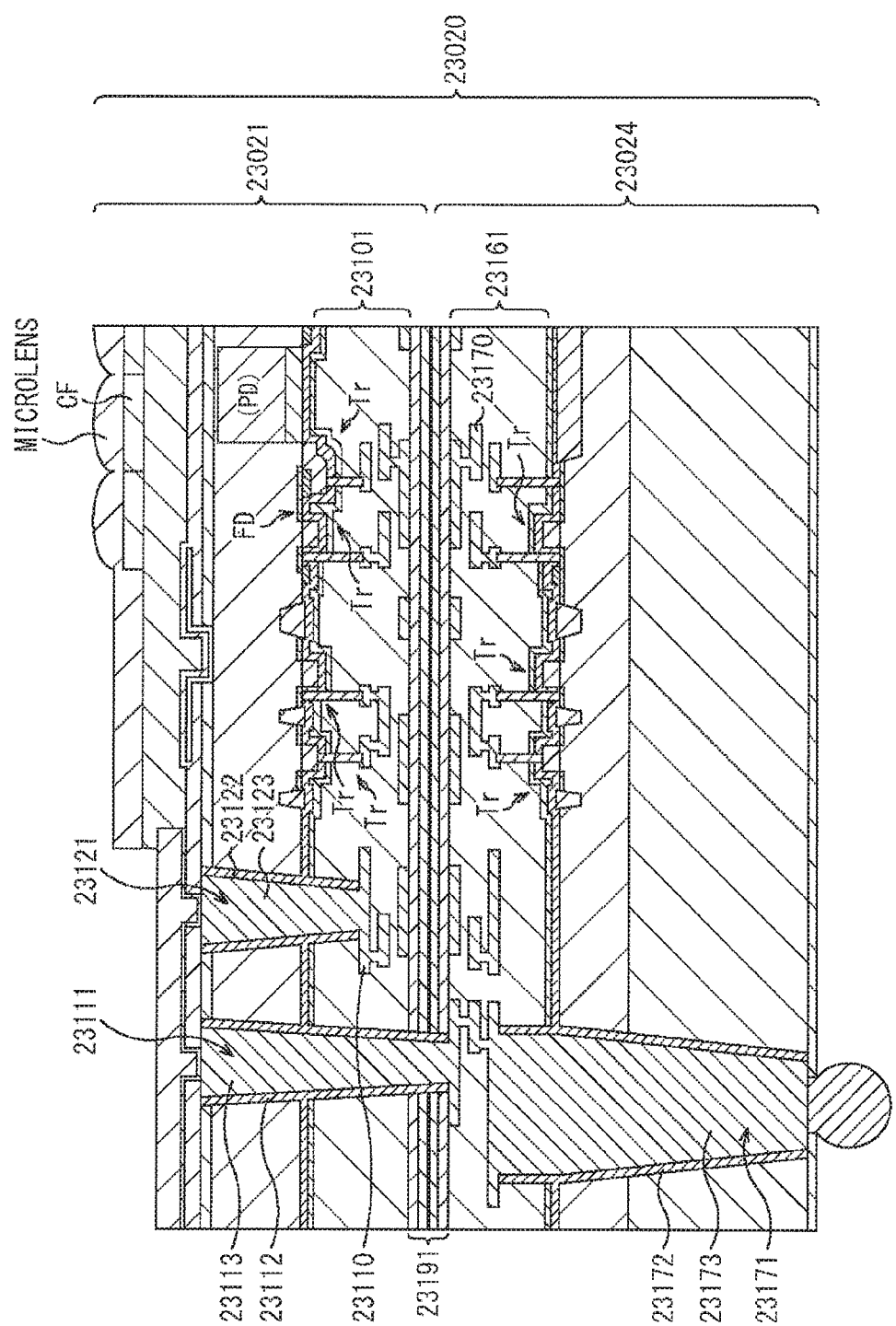
[FIG. 19]

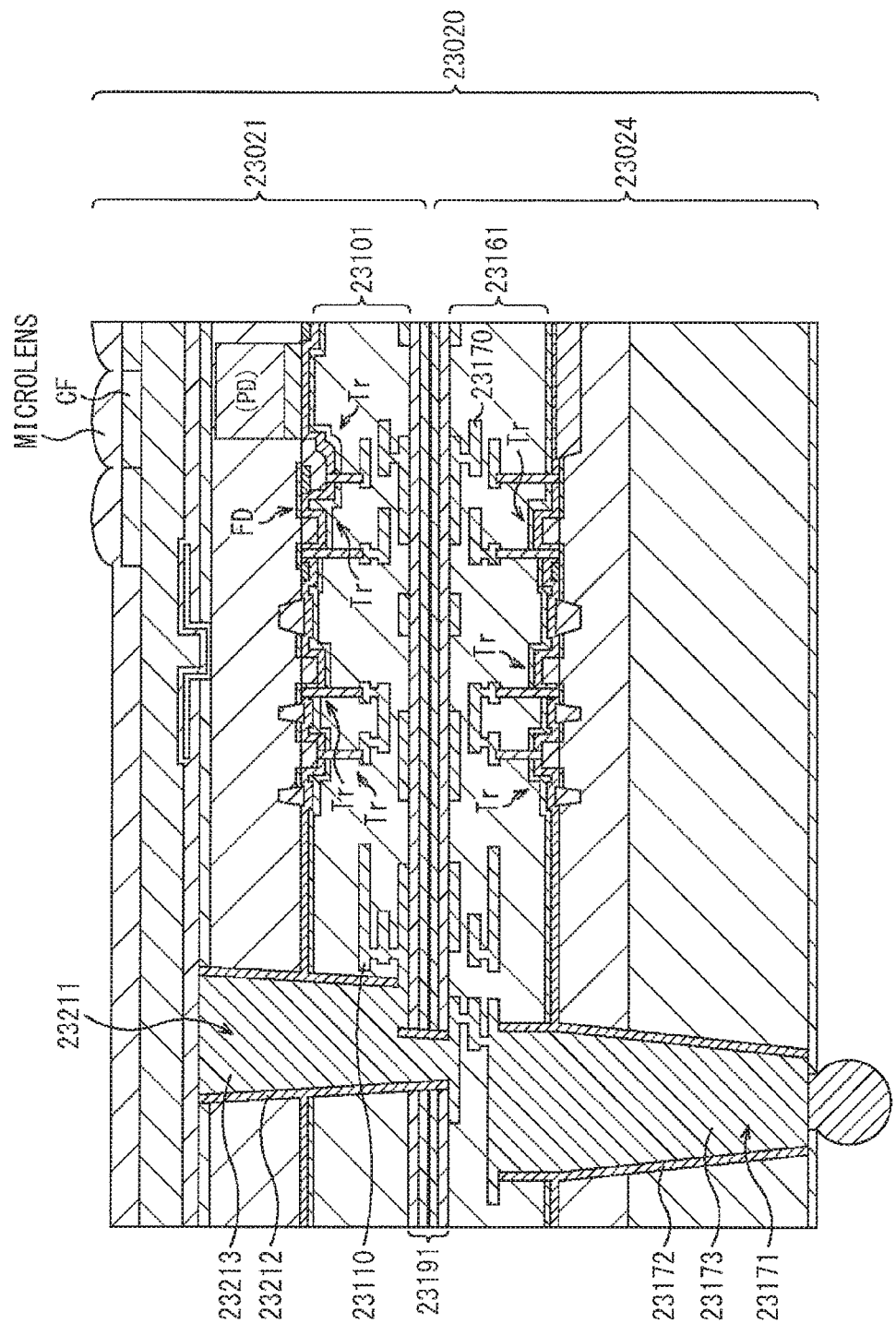
[FIG. 20]

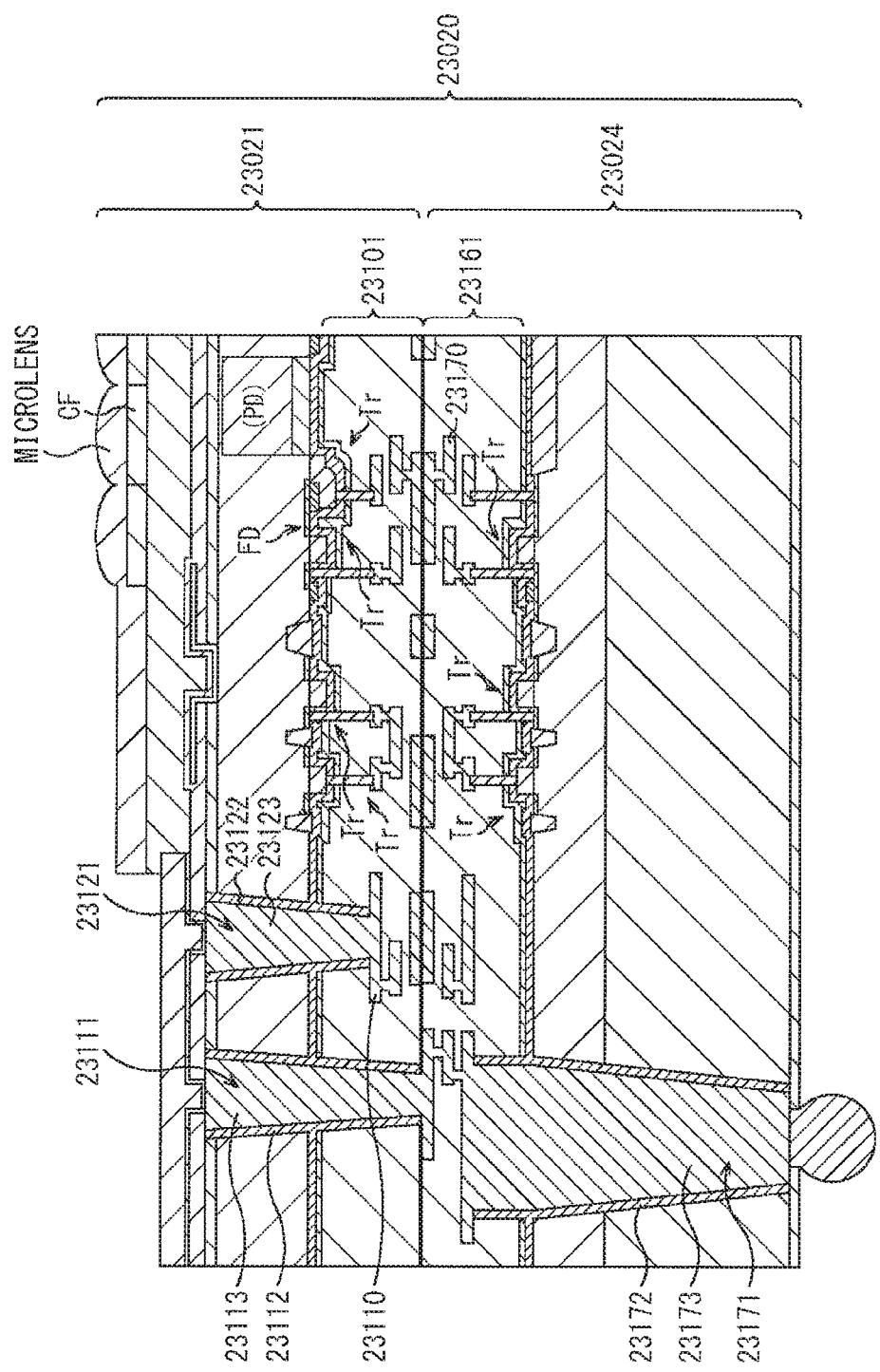

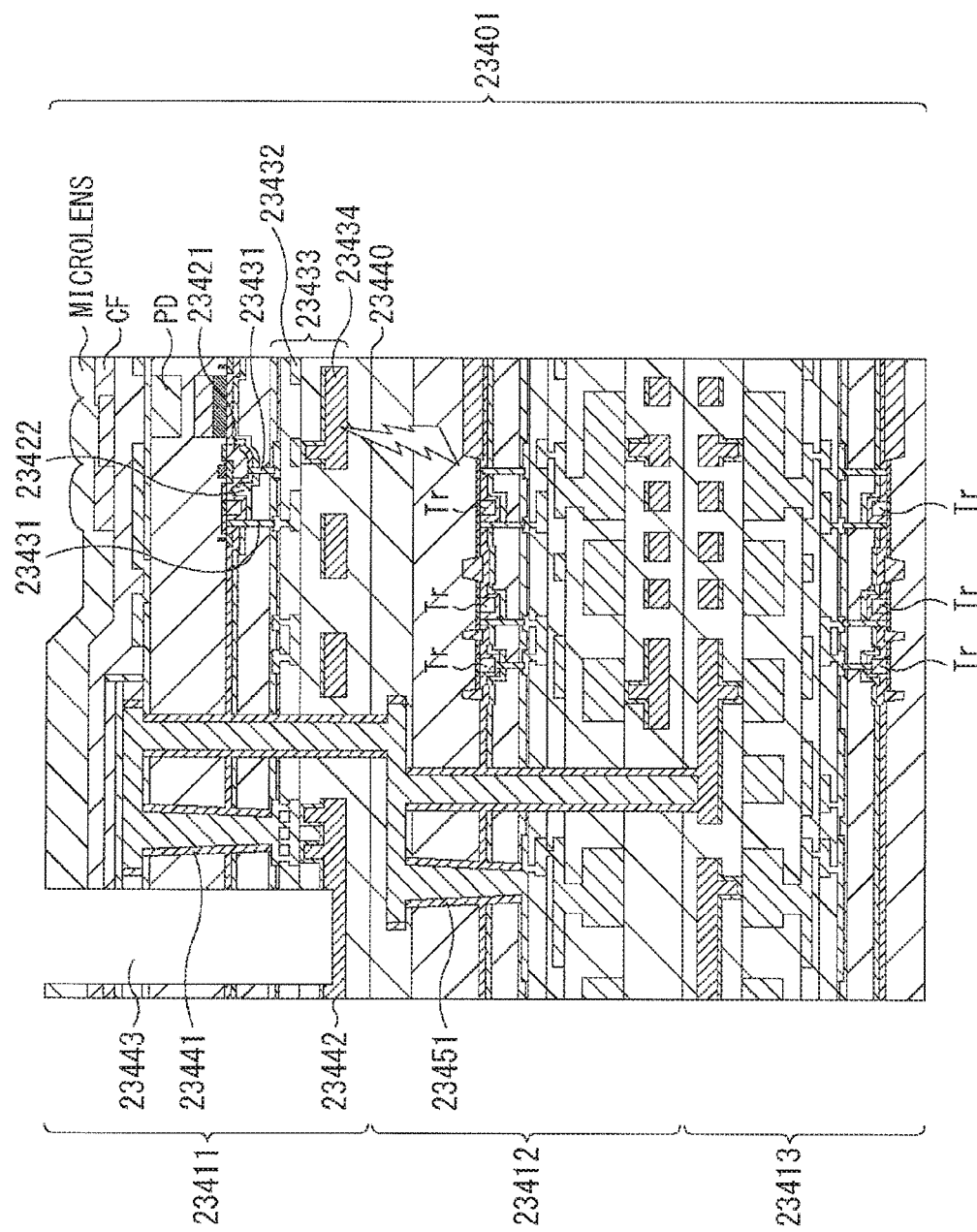
[FIG. 22]

IMAGING DEVICE, METHOD OF PRODUCING IMAGING DEVICE, IMAGING APPARATUS, AND ELECTRONIC APPARATUS

CROSS REFERENCE TO RELATED APPLICATIONS

This application is a U.S. National Phase of International Patent Application No. PCT/JP2018/031870 filed on Aug. 29, 2018, which claims priority benefit of Japanese Patent Application No. JP 2017-174899 filed in the Japan Patent Office on Sep. 12, 2017. Each of the above-referenced applications is hereby incorporated herein by reference in its entirety.

TECHNICAL FIELD

The present disclosure relates to an imaging device, a method of producing an imaging device, an imaging apparatus, and an electronic apparatus. In particular, the present disclosure relates to an imaging device that enables formation of an inorganic film over the entirety of a film formation region of a flat surface of a singulated glass sheet therein and a method of producing the imaging device. The present disclosure also relates to an imaging apparatus and an electronic apparatus.

BACKGROUND ART

Imaging devices have been proposed that each suppress degradation of optical performance thereof by keeping light from an oblique direction from entering the imaging device with an inorganic film such as an AR (Anti Reflection) film and an IRCF (Infra-Red Cut Filter) film formed on a glass sheet of the imaging device (see PTL 1 and PTL 2).

CITATION LIST

Patent Literature

PTL 1: Japanese Unexamined Patent Application Publication No. 2015-170638
PTL 2: Japanese Unexamined Patent Application Publication No. 2015-012474

SUMMARY OF THE INVENTION

Problems to be Solved by the Invention

Be aware that according to the technique for producing imaging devices disclosed in PTL 1 and PTL 2, an inorganic film such as an AR (Anti Reflection) film and an IRCF (Infra-Red Cut Filter) film is formed at once on glass sheets of the imaging devices while a plurality of singulated imaging device chips is accommodated in a chip tray.

The chip tray is provided with a plurality of openings having substantially the same size as the singulated imaging device chips. Each of the openings is provided with an inward claw and receives a glass sheet of an imaging device being fitted into the opening such that the claw thereof abuts a peripheral portion of the glass sheet while exposing the glass sheet from the opening. The film formation is performed on the glass sheets fixed in such a state.

However, the claws fixing the glass sheets each shade a portion of the corresponding glass sheet, creating a non-film region under or around the claw, in which the film formation is not feasible.

Accordingly, a possible way to form a film over the entirety of a film formation region over which the film is to be formed is reducing a size of the claws that fix the imaging device chips in consideration of the non-film region.

However, although reducing the size of the claws that fix the imaging device chips makes it possible to form a film over the film formation region, the claws having the reduced size can allow the imaging device chips to fall off the tray unless each of the imaging device chips and the corresponding opening are aligned accurately.

The present disclosure has been achieved in view of the above-described circumstances particularly to enable formation of an inorganic film over the entirety of the film formation region of a flat surface of a glass sheet in a singulated imaging device.

Means for Solving the Problems

An imaging device according to an aspect of the present disclosure includes an image sensor that captures an image and a glass sheet disposed on the image sensor. The glass sheet has a peripheral portion provided with a recess.

The peripheral portion provided with the recess may be located outside a film formation region of the glass sheet. The film formation region may be a region over which an inorganic film is to be formed.

The recess may be in a shape corresponding to a claw on a periphery of an opening provided in a tray for formation of an inorganic film on the glass sheet.

The recess may be in a step-like shape.

The recess may be tapered and be in a flat surface shape.

The recess may be in a curved surface shape.

The recess may have a surface provided with a light-absorbing black resin section.

An inorganic film may be formed on the glass sheet.

The inorganic film may be an AR (Anti Reflection) film or an IRCF (Infra-Red Cut Filter) film.

An imaging apparatus according to an aspect of the present disclosure includes an image sensor that captures an image and a glass sheet disposed on the image sensor. The glass sheet has a peripheral portion provided with a recess.

An electronic apparatus according to an aspect of the present disclosure includes an image sensor that captures an image and a glass sheet disposed on the image sensor. The glass sheet has a peripheral portion provided with a recess.

A method of producing an imaging device according to an aspect of the present disclosure includes a first step and a second step. The imaging device includes an image sensor that captures an image and a glass sheet disposed on the image sensor. The glass sheet has a peripheral portion provided with a recess. In the first step, first grooves are formed in an undiced imaging device along central lines of dicing lines using first blades having a predetermined width. In the second step, the undiced imaging device is diced along the central lines of the dicing lines using second blades having a width smaller than the predetermined width.

The first blades may be V-shaped blades.

The method may further include a third step, a fourth step, and a fifth step. In the third step, second grooves are formed in the undiced imaging device along the central lines of the dicing lines using third blades after the first step. The second grooves have a depth larger than the first grooves. The third blades have a width smaller than the predetermined width of the first blades and larger than the width of the second blades. In the fourth step, the second grooves are filled with a black resin. In the fifth step, third grooves are formed in the undiced imaging device along the central lines of the dicing lines using fourth blades. The third grooves have a depth smaller than the first grooves. The fourth blades have a width smaller than the predetermined width of the first blades and larger than the width of the third blades. After the fifth step, the second step may be performed to dice the undiced imaging device along the central lines of the dicing lines using the second blades.

The first blades and the fourth blades may be the same V-shaped blades, and the first blades and the fourth blades may be different in depth of grooves to form.

The method may further include a sixth step of forming an inorganic film on the glass sheet after the second step.

The inorganic film may be an AR (Anti Reflection) film or an IRCF (Infra-Red Cut Filter) film.

An aspect of the present disclosure includes an image sensor that captures an image and a glass sheet disposed on the image sensor. The glass sheet has a peripheral portion provided with a recess.

Effects of the Invention

According to an aspect of the present disclosure, it is particularly possible to form an inorganic film over the entirety of a film formation region of a flat surface of a glass sheet in a singulated imaging device.

BRIEF DESCRIPTION OF DRAWINGS

FIG. 1 is a diagram explaining a method of forming an inorganic film on a glass sheet of an imaging device.

FIG. 2 is a diagram explaining a method of forming an inorganic film over the entirety of a film formation region of the glass sheet of the imaging device.

FIG. 3 is a diagram explaining a configuration example of a first embodiment of the imaging device according to the present disclosure.

FIG. 4 is a diagram explaining a method of producing the imaging device in FIG. 3.

FIG. 5 is a diagram explaining a configuration example of a second embodiment of the imaging device according to the present disclosure.

FIG. 6 is a diagram explaining a method of producing the imaging device in FIG. 5.

FIG. 7 is a diagram explaining occurrence of ghost and flare in the image device.

FIG. 8 is a diagram explaining a configuration example of a third embodiment of the imaging device according to the present disclosure.

FIG. 9 is a diagram explaining a method of producing the imaging device in FIG. 8.

FIG. 10 is a diagram explaining a configuration example of a fourth embodiment of the imaging device according to the present disclosure.

FIG. 11 is a diagram explaining a method of producing the imaging device in FIG. 10.

FIG. 12 is a block diagram illustrating a configuration example of an imaging apparatus being an electronic apparatus to which the imaging device according to the present disclosure has been applied.

FIG. 13 is a diagram explaining usage examples of an imaging device to which a technique of the present disclosure has been applied.

FIG. 14 is a view depicting an example of a schematic configuration of an endoscopic surgery system.

FIG. 15 is a block diagram depicting an example of a functional configuration of a camera head and a camera control unit (CCU).

FIG. 16 is a block diagram depicting an example of schematic configuration of a vehicle control system.

FIG. 17 is a diagram of assistance in explaining an example of installation positions of an outside-vehicle information detecting section and an imaging section.

FIGS. 18A and 18B] FIGS. 18A and 18B are diagrams illustrating an overview of configuration examples of a stacked solid-state imaging apparatus to which the technique according to the present disclosure is applicable.

FIG. 19 is a cross-sectional view illustrating a first configuration example of a stacked solid-state imaging apparatus 23020.

FIG. 20 is a cross-sectional view illustrating a second configuration example of the stacked solid-state imaging apparatus 23020.

FIG. 21 is a cross-sectional view illustrating a third configuration example of the stacked solid-state imaging apparatus 23020.

FIG. 22 is a cross-sectional view illustrating another configuration example of the stacked solid-state imaging apparatus to which the technique according to the present disclosure is applicable.

MODES FOR CARRYING OUT THE INVENTION

The following describes preferred embodiments of the present disclosure in detail with reference to the accompanying drawings. It should be noted that in this specification and the drawings, constituent elements that have substantially the same functional configuration are indicated by the same reference signs, and thus redundant description thereof is omitted.

The following describes modes (referred to below as embodiments) for carrying out the present disclosure. It should be noted that the description is given in the following order.

1. Inorganic Film Formation Method
2. First Embodiment
3. Second Embodiment
4. Third Embodiment
5. Fourth Embodiment
6. Example of Application to Electronic Apparatus
7. Usage Examples of Imaging Device
8. Example of Application to Endoscopic Surgery System
9. Example of Application to Mobile Body
10. Configuration Examples of Stacked Solid-state Imaging apparatus to which Technique according to Present Disclosure is Applicable 1. Inorganic Film Formation Method An imaging device according to the present disclosure enables formation of an inorganic film over the entirety of a film formation region of a singulated glass sheet. For description of the imaging device according to the present disclosure, a method of forming an inorganic film on a singulated glass sheet will be described.

An upper left part of FIG. 1 illustrates a configuration example of a singulated imaging device (also referred to as a solid-state imaging apparatus) 11. The imaging device 11 has a three-layer structure including a glass sheet 31, a resin layer 32, and a sensor section 33 in order from top to bottom of FIG. 1. The resin layer 32 for example includes a transparent resin and bonds the sensor section 33 and the glass sheet 31 together.

An AR (Anti Reflection) film 41 being an inorganic film is formed on a surface F1, which is an upper surface in FIG. 1, of the glass sheet 31 illustrated in the upper left part of FIG. 1.

More specifically, as illustrated in a lower left part of FIG. 1, a tray 51 is provided with arrayed quadrilateral openings 61 each having substantially the same size as the imaging device 11. A singulated imaging device 11 is fixed in each of the openings 61 with the glass sheet 31 facing downward in the paper sheet of FIG. 1. The AR film 41 being an inorganic film is formed on the surface F1 of the glass sheet 31 exposed from the opening 61 through vapor deposition as illustrated in an upper right part of FIG. 1.

That is, as illustrated in the upper right part of FIG. 1 and an enlarged view ex 1 in a lower right part of FIG. 1, each of the openings 61 is provided with a claw 62 on a periphery thereof, and the claw 62 abuts the glass sheet 31 of the corresponding imaging device 11 at a peripheral portion of the surface F1 to fix the surface F1 of the glass sheet 31 with the surface F1 exposed from the opening 61. As a result, the AR film 41 being an inorganic film is formed through vapor deposition on the surface F1 of the glass sheet 31 fixed while being exposed from the opening 61. It should be noted that arrows in FIG. 1 represent the vapor deposition through which the AR film 41 is formed.

Be aware that each of the claws 62 protrudes onto the surface F1 of the corresponding glass sheet 31. When the AR film 41 being an inorganic film is formed as illustrated in FIG. 1, therefore, the claw 62 is likely to create a non-film region in a portion of a film formation region that is located in the peripheral portion of the glass sheet 31, as illustrated in an upper part of FIG. 2.

An upper left part of FIG. 2 illustrates a configuration corresponding to the upper right part of FIG. 1. Furthermore, an enlarged view ex 11 of a rectangular portion in an upper right part of FIG. 2 is an enlarged view of a rectangular portion in the upper left part of FIG. 2. A portion of the glass sheet 31 that is located on the left side of a dotted line in FIG. 2 is the film formation region. However, as indicated by a range Z1 in the enlarged view ex 11, the claw 62 protruding onto the glass sheet 31 produces shade, preventing the AR film 41 being an inorganic film from being formed over the entirety of the film formation region whose boundary is indicated by dotted lines. That is, as indicated by the range Z1 in the enlarged view ex 11, the film formation method described with reference to FIG. 1 can leave a region in which formation of the AR film 41 being an inorganic film has been unsuccessful in a portion of the film formation region of the glass sheet 31.

A possible way to solve such an issue is reducing a length of the claw 62 in the upper left part of FIG. 2 to a length of a claw 62' in a middle part of FIG. 2 to increase a width of the opening 61 from a width W1 illustrated in the upper part of FIG. 2 to a width W11 illustrated in the middle part of FIG. 2, so that the AR film 41 is able to be formed over the entirety of the film formation region indicated by the dotted lines including an end portion thereof as illustrated in an enlarged view ex12 in a middle right part of FIG. 2.

However, as a result of the claw 62 being replaced with the claw 62' and the width of the opening 61 being changed from the width W1 to the width W11 as illustrated in the middle part of FIG. 2 to enable formation of the AR film 41 over the entirety of the film formation region, an area of abutment of the claw 62' against the peripheral portion of the glass sheet 31 becomes smaller. Even a slight misalignment of the glass sheet 31 relative to the opening 61, for example, can therefore cause the imaging device 11 to fall off the tray 51 from the opening 61 due to the claw 62' failing to abut the peripheral portion of the glass sheet 31 as illustrated in a lower right part of FIG. 2.

2. First Embodiment

The imaging device according to the present disclosure is therefore provided, on an outer periphery of the film formation region, with a recess to be abutted by a claw on an outer periphery of an opening provided in a tray, so that the entirety of the film formation region is exposed from the opening and an inorganic film is able to be formed over the entirety of the exposed film formation region through a vapor deposition process.

FIG. 3 illustrates a configuration example of a first embodiment of the imaging device according to the present disclosure that enables formation of an inorganic film over the entirety of the film formation region.

As illustrated in an upper part of FIG. 3, an imaging device 101 includes a glass sheet 131, a resin layer 132, and a sensor section 133 in order from top to bottom of FIG. 3, and the resin layer 132, which is transparent, bonds the glass sheet 131 and the sensor section 133 together. The sensor section 133 includes, for example, a CMOS (Complementary Metal Oxide Semiconductor) image sensor. The sensor section 133 generates an image from light entering from a subject through the glass sheet 131 and the resin layer 132, and outputs the image.

Furthermore, the top of the glass sheet 131 in FIG. 3 is a surface F101 including the film formation region over which an AR film 141 (lower part of FIG. 3) being an inorganic film is to be formed. A recess 111 is provided in a periphery of the surface F101. As illustrated in the lower part of FIG. 3, the recess 111 is in a step-like shape to be abutted by a claw 162 provided around an opening 161 provided in a tray 151 corresponding to the tray 51 in FIG. 1. As illustrated in the upper part of FIG. 3, the recess 111 is formed as a surface one step lower than a reference surface, which in FIG. 3 is the surface F101, and a level difference therebetween is substantially the same as a height of the claw 162.

Such a configuration exposes the surface F101 from the opening 161 as illustrated in an enlarged view ex31 of a rectangular region in a lower left part of FIG. 3. The AR film 141 including an inorganic film is therefore formed to cover an end portion of the surface F101 including the film formation region located on the left side of a dotted line. Thus, it is possible to suppress creation of a non-film region, and reduce occurrence of ghost and flare due to light that can enter through the non-film region.

Furthermore, the surface F101 including the film formation region of the glass sheet 131 is described as having substantially the same shape and substantially the same size as the opening 161. To be exact, the surface F101 is slightly smaller than the opening 161 and protrudes frontward from the recess 111 when viewed from an image plane of the sensor section 133. The imaging device 101 is therefore to be fixed such that the surface F101 of the glass sheet 131 is fitted into the opening 161 and the recess 111 is abutted by the claw 162. Since the entirety of the surface F101 including the film formation region of the glass sheet 131 is thus exposed from the opening 161, it is possible to form the AR film 141 over the entirety of the surface F101 through a vapor deposition process and keep the imaging device 101 from falling off from the opening 161.

<Method of Producing Imaging Device in FIG. 3>

The following describes a method of producing the imaging device in FIG. 3 with reference to FIG. 4.

In a first step, the sensor section 133 prior to singulation for the imaging device 101 is attached to a dicing sheet 181 with the glass sheet 131 facing upward as illustrated in an uppermost portion of a left part of FIG. 4.

In a second step, as illustrated in a second portion from the top of the left part of FIG. 4, blades 201 are fixed such that a location of a central line of each of the blades 201 coincides with a location of a central line of a corresponding one of dicing lines for the singulated imaging device 101 and a distance between inner surfaces of the blades 201 is equal to a width of the film formation region. Subsequently, the blades 201 in such a state are then used to form grooves 131a in the glass sheet 31 (see a third portion from the top of the left part of FIG. 4).

In a third step, as illustrated in the third portion from the top of the left part of FIG. 4, the blades 201 are pulled out, and then blades 211 are positioned such that a location of a central line of each of the blades 211 coincides with the location of the central line of a corresponding one of the dicing lines for the singulated imaging device 101. The blades 211 in such a state are used to cut (dice) the glass sheet 131, the resin layer 132, the sensor section 133, and the dicing sheet 181.

In a fourth step, the blades 211 are pulled out, thereby yielding the singulated imaging device 101 as illustrated in a lowermost portion of the left part of FIG. 4.

That is, as a result of the singulated imaging device 101 being yielded by cutting the grooves 131a along central lines thereof using the blades 211, opposite end portions of the grooves 131a are formed to be the recess 111 in an end portion of the glass sheet 31 of the imaging device 101.

Thus, of the glass sheet 31, a range excluding the recess 111 is formed as the surface F101 including the film formation region. The surface F101 has substantially the same shape and substantially the same size as the opening 161 of the tray 151. To be exact, the surface F101 is slightly smaller than the opening 161.

In a fifth step, as illustrated in an upper right part of FIG. 4, the imaging device 101 is turned upside-down and placed such that the recess 111 is abutted by the claw 162. The vapor deposition process is performed from below in FIG. 4 on the surface F101 being the film formation region exposed from the opening 161, and thus the AR film 141 being an inorganic film is able to be formed over the entirety of the surface F101 being the film formation region.

It should be noted that the blades 201 and 211 are dicing blades. A lateral width of the recess 111 may be adjusted by setting a width of the blades 201 to a value approximately six to ten times a width of the blades 211 for the singulation.

Furthermore, any film other than the AR film 141 may be formed on the surface F101 including the film formation region as long as the film is an inorganic film. For example, an IRCF (Infra-Red Cut Filter) film may be formed.

3. Second Embodiment

Through the above, an example of the imaging device 101 has been described that includes the recess 111 formed in the periphery of the surface F101 including the film formation region of the glass sheet 31. According to this configuration, the recess 111 is abutted by the claw 162 of the tray 151, and the surface F101 including the film formation region of the glass sheet 31 is exposed from the opening 161, enabling formation of an inorganic film over the entirety of the surface F101 including the film formation region. However, the claw 162 may be tapered, and the recess 111 may accordingly be tapered, as long as a configuration that allows the surface F101 including the film formation region of the glass sheet 31 to be exposed from the opening 161 is achieved.

A left part of FIG. 5 illustrates a configuration example of a second embodiment of the imaging device according to the present disclosure provided with a recess, which replaces the recess 111, to be abutted by a tapered claw, which replaces the claw 162. It should be noted that constituent elements in FIG. 5 corresponding to the constituent elements in FIG. 3 are indicated by the same reference signs as in FIG. 3, and description thereof is omitted as appropriate.

The configuration of the imaging device 101 in the left part of FIG. 5 is different from the configuration in FIG. 3 in that a tapered recess 111' is provided instead of the recess 111 of the glass sheet 31. Furthermore, a tapered claw 162' that matches the taper of the recess 111' is provided instead of the claw 162 of the tray 151.

That is, in this configuration, the surface F101 including the film formation region protrudes frontward from the recess 111' when viewed from the image plane of the sensor section 133. Furthermore, an angle of the taper of the claw 162' and an angle of the taper of the recess 111' correspond to each other. The claw 162' abuts the recess 111' with the surface F101 including the film formation region exposed from an opening 161'. The AR film 141 being an inorganic film is formed on the exposed surface F101 including the film formation region as indicated by a range Z51 in an enlarged view ex51 of a rectangular range of the left part of FIG. 5.

As a result, it is possible to form the AR film 141 including an inorganic film over the entirety of the surface F101 including the film formation region.

Furthermore, a width W31 of the opening 161' is wider than the surface F101 including the film formation region as illustrated in the left part of FIG. 5. It is therefore possible to form, by the above-described configuration, the AR film 141 being an inorganic film also on the recess 111' of the glass sheet 31 over a region that is not abutted by the claw 162' as particularly indicated by a range Z52 in an enlarged view ex52 in a right part of FIG. 5. This configuration enables suppression of entry of reflected light not only from the surface F101 including the film formation region but also from directions of side surfaces adjacent to the surface F101, reducing occurrence of ghost and flare.

<Method of Producing Imaging Device in FIG. 5>

The following describes a method of producing the imaging device 101 in FIG. 5 with reference to FIG. 6.

In a first step, the sensor section 133 prior to singulation for the imaging device 101 is attached to the dicing sheet 181 with the glass sheet 131 facing upward as illustrated in an uppermost portion of FIG. 6.

In a second step, as illustrated in a second portion from the top of FIG. 6, a location of a central line of each of V-shaped blades 231 is made to coincide with a location of a central line of a corresponding one of dicing lines for the singulated imaging device 101 and a distance between inner surfaces of the V-shaped blades 231 is made equal to the width of the film formation region. The blades 231 in such a state are then used to form grooves 131b (see a third portion from the top of FIG. 6) in the glass sheet 131.

In a third step, as illustrated in the third portion from the top of FIG. 6, blades 241 are positioned such that a location of a central line of each of the blades 241 coincides with the location of the central line of a corresponding one of the dicing lines for the singulated imaging device 101. The blades 241 in such a state are then used to cut (dice) the glass sheet 131, the resin layer 132, the sensor section 133, and the dicing sheet 181.

In a fourth step, the blades 241 are pulled out, thereby yielding the singulated imaging device 101 as illustrated in a lowermost portion of FIG. 6.

That is, as a result of the singulated imaging device 101 being yielded by cutting the grooves 131b along central lines thereof using the blades 241, opposite end portions of the grooves 131b are formed to be the tapered recess 111' in the end portion of the glass sheet 131 of the imaging device 101.

Thus, of the glass sheet 31, a range excluding the recess 111' is formed as the surface F101 including the film formation region. The surface F101 has substantially the same shape and substantially the same size as the opening 161 of the tray 151. To be exact, the surface F101 is slightly smaller than the opening 161.

In a fifth step, as illustrated in the left part of FIG. 5, the imaging device 101 is turned upside-down and placed such that the recess 111' is abutted by the corresponding tapered claw 162'. The vapor deposition process is performed from below in FIG. 5 on the surface F101 being the film formation region exposed from the opening 161, and thus the AR film 141 being an inorganic film is able to be formed over the entirety of the surface F101 being the film formation region.

Furthermore, as indicated by the range Z52 in the enlarged view ex52 of the right part of FIG. 5, the above-described configuration allows the AR film 141 to be formed also on the recess 111' over a partial region that is not abutted by the claw 162' through the above-described vapor deposition process. This enables reduction of occurrence of ghost and flare due to entry of light from an oblique direction, such as reflected light.

That is, since the recess 111 in the first embodiment or the recess 111' in the second embodiment is provided in the peripheral portion of the glass sheet 131 to correspond to the claw 162 or 162' provided on the periphery of the opening 161 of the tray 151, the surface F101 including the film formation region is exposed from the opening 161 or 161', and an inorganic film is formed over the entirety of the surface F101.

In other words, a similar effect is produced as long as a recess corresponding to the claw of the opening of the tray is provided in the peripheral portion of the glass sheet 131. Therefore, the shape of the recess that is provided in the peripheral portion of the glass sheet 131 is not limited to those of the recess 111 (step-like shape) and the recess 111' (flat surface shape). In addition to the step-like shape and the flat surface shape, any shape such as a curved surface shape and a free-form curved surface shape is possible as long as edges of the peripheral portion of the glass sheet 131 are recessed or ground off into a shape corresponding to the claw of the opening of the tray.

4. Third Embodiment

Through the above, the imaging device 101 has been described that enables formation of the AR film 141 being an inorganic film over the entirety of the surface F101 including the film formation region of the glass sheet 31. Additionally, the imaging device 101 may be enabled to reduce occurrence of ghost and flare due to a factor such as reflected light and multiply reflected light.

That is, for example, in a case where the imaging device 101 including the glass sheet 131, the resin layer 132, and the sensor section 133 is disposed on a substrate 301 as illustrated in a left part of FIG. 7, incoming light, which is indicated by a ray trajectory L1, that has entered the glass sheet 131 and the resin layer 132 can enter the sensor section 133 after being reflected by a surface of the sensor section 133 and end portions of the glass sheet 131 and the resin layer 132 to cause ghost and flare.

Furthermore, likewise, incoming light indicated by a ray trajectory L11 in a right part of FIG. 7 can be reflected by a circuit 311 provided on the substrate 301, and the reflected light can enter the sensor section 133 from the side surfaces. Also, incoming light indicated by a ray trajectory L12 can be reflected by the circuit 311 and a surface of the glass sheet 131, and the reflected light can enter the sensor section 133. Such reflected light can cause ghost and flare.

A light-absorbing black resin section may therefore be formed on ends of the glass sheet 131 to suppress entry of light from the side surfaces, and thus reduce occurrence of ghost and flare due to reflected light and multiply reflected light.

FIG. 8 illustrates a configuration example of a third embodiment of the imaging device 101 enabled to reduce occurrence of ghost and flare due to reflected light and multiply reflected light by suppressing entry of light from the side surfaces with the light-absorbing black resin section formed on the ends of the glass sheet 131. It should be noted that constituent elements of the imaging device 101 in FIG. 8 that have the same functions as the constituent elements of the imaging device 101 in FIG. 3 are indicated by the same reference signs as in FIG. 3, and description thereof is omitted as appropriate.

That is, the imaging device 101 in FIG. 8 is different from the imaging device 101 in FIG. 3 in that a light-absorbing black resin section 321 is formed on an abutment surface of the recess 111, which is to be abutted by the claw 162 of the tray 151.

Such a configuration enables the imaging device 101 to reduce occurrence of ghost and flare, because the black resin section 321 absorbs incoming light and reflected light entering from directions of the side surfaces of the glass sheet 131 of the imaging device 101.

<Method of Producing Imaging Device in FIG. 8>

The following describes a method of producing the imaging device 101 in FIG. 8 with reference to FIG. 9.

In a first step, the sensor section 133 prior to singulation for the imaging device 101 is attached to the dicing sheet 181 with the glass sheet 131 facing upward as illustrated in an uppermost portion of a left part of FIG. 9.

In a second step, as illustrated in a second portion from the top of the left part of FIG. 9, a location of a central line of each of blades 331 is made to coincide with a location of a central line of a corresponding one of dicing lines for the singulated imaging device 101 and a distance between inner surfaces of the blades 331 is made equal to the width of the film formation region. The blades 331 in such a state are then used to form grooves 131c (see a third portion from the top of the left part of FIG. 9) in the glass sheet 131.

In a third step, as illustrated in the third portion from the top of the left part of FIG. 9, blades 341 are positioned such that a location of a central line of each of the blades 341 coincides with the location of the central line of a corresponding one of the dicing lines for the singulated imaging device 101. The blades 341 in such a state are then used to form grooves 131d (see a fourth portion from the top of the left part of FIG. 11) having a depth extending from an inside of the glass sheet 131 through the resin layer 132 to an inside of the sensor section 133.

In a fourth step, as illustrated in a fourth portion from the top of the left part of FIG. 9, the blades 341 are pulled out, forming grooves 351, each of which is a combination of the groove 131c and the groove 131d.

In a fifth step, as illustrated in a lowermost portion of the left part of FIG. 9, the grooves 351 are filled with a black resin 371.

In a sixth step, as illustrated in an uppermost portion of a right part of FIG. 9, blades 381 having a width smaller than the grooves 131c, which in other words is a width smaller than the blades 331, are used to form grooves 131e (see a second portion from the top of the right part of FIG. 9) having a smaller width and a smaller depth than the grooves 131c in the black resin 371.

In a seventh step, as illustrated in the second portion from the top of the right part of FIG. 9, blades 391 having a smaller width than the blades 341 are positioned such that a location of a central line of each of the blades 391 coincides with the location of the central line of a corresponding one of the dicing lines for the singulated imaging device 101. The blades 391 in such a state are then used to cut (dice) the glass sheet 131, the resin layer 132, the sensor section 133, and the dicing sheet 181.

In an eighth step, the blades 391 are pulled out, thereby yielding the singulated imaging device 101 as illustrated in a third portion from the top of the right part of FIG. 9.

As a result of the singulated imaging device 101 being yielded by cutting the grooves 131e along central lines thereof using the blades 391, opposite end portions of the grooves 131e are formed to be the recess 111 in the end portion of the glass sheet 131 of the imaging device 101. Furthermore, the black resin 371 is left as the grooves 131e in the recess 111, thereby forming the black resin section 321 in FIG. 8.

Thus, of the glass sheet 31, a range excluding the recess 111 is formed as the surface F101 including the film formation region having the same shape as the opening 161 of the tray 151. The recess 111 is abutted by the claw 162 with the surface F101 being the film formation region exposed from the opening 161 as illustrated in FIG. 8, allowing the AR film 141 being an inorganic film to be formed on the entirety of the surface F101 being the film formation region.

Furthermore, the black resin section 321 (black resin 371) that spans side surfaces of the imaging device 101 is formed on the surface of the recess 111 as illustrated in a lowermost portion of the right part of FIG. 9. Since the black resin section 321 absorbs incoming light and reflected light entering from the side surfaces, it is possible to reduce occurrence of ghost and flare.

5. Fourth Embodiment

Through the above, an example of the imaging device 101 has been described that reduces occurrence of ghost and flare by absorbing light such as reflected light and multiply reflected light with the black resin 371 (321) formed on the recess 111 to span the side surfaces of the imaging device 101. However, the black resin section may be formed on a surface of the tapered recess 111' described with reference to FIG. 5 to reduce occurrence of ghost and flare.

FIG. 10 illustrates a configuration example of a fourth embodiment of the imaging device 101 enabled to reduce occurrence of ghost and flare due to reflected light and multiply reflected light by suppressing entry of light from the side surfaces with the black resin section or the like formed on the surface of the recess 111' of the glass sheet 131. It should be noted that constituent elements of the imaging device 101 in FIG. 10 that have the same functions as the constituent elements of the imaging device 101 in FIG. 5 are indicated by the same reference signs as in FIG. 5, and description thereof is omitted as appropriate.

That is, the imaging device 101 in FIG. 10 is different from the imaging device 101 in FIG. 5 in that a light-absorbing black resin section 411 that spans the side surfaces of the imaging device 101 is formed on the surface of the recess 111'.

Such a configuration enables the imaging device 101 to reduce occurrence of ghost and flare, because the black resin section 411 absorbs incoming light and reflected light entering from directions of the side surfaces.

<Method of Producing Imaging Device in FIG. 10>

The following describes a method of producing the imaging device 101 in FIG. 10 with reference to FIG. 11.

In a first step, the sensor section 133 prior to singulation for the imaging device 101 is attached to the dicing sheet 181 with the glass sheet 131 facing upward as illustrated in an uppermost portion of a left part of FIG. 11.

In a second step, as illustrated in a second portion from the top of the left part of FIG. 11, a location of a central line of each of V-shaped blades 421 is made to coincide with a location of a central line of a corresponding one of dicing lines for the singulated imaging device 101 and a distance between inner surfaces of the V-shaped blades 421 is made equal to the width of the film formation region. The blades 421 are then used to form grooves 131f (see a third portion from the top of the left part of FIG. 11) in the glass sheet 131.

In a third step, as illustrated in the third portion from the top of the left part of FIG. 11, blades 431 having a smaller width than the V-shaped blades 421 are positioned such that a location of a central line of each of the blades 431 coincides with the location of the central line of a corresponding one of the dicing lines for the singulated imaging device 101. The blades 431 in such a state are then used to cut the glass sheet 131, the resin layer 132, and the sensor section 133 to form grooves 131g (see a fourth portion from the top of the left part of FIG. 11).

In a fourth step, as illustrated in the fourth portion from the top of the left part of FIG. 11, the blades 431 are pulled out, forming grooves 451, each of which is a combination of the groove 131f and the groove 131g.

In a fifth step, as illustrated in a lowermost portion of the left part of FIG. 11, the grooves 451 are filled with a black resin 471.

In a sixth step, as illustrated in an uppermost portion of a right part of FIG. 11, the blades 421 are positioned such that the location of the central line of each of the blades 421 coincides with a location of a corresponding one of ends of the singulated imaging device 101. The blades 421 in such a state are then used to form grooves 131h (see a second portion from the top of the right part of FIG. 11) having a smaller width and a smaller depth than the grooves 131f in the black resin 371.

In a seventh step, as illustrated in the second portion from the top of the right part of FIG. 11, blades 491 having a smaller width than the blades 431 are positioned such that a location of a central line of each of the blades 491 coincides with the location of the central line of a corresponding one of the dicing lines for the singulated imaging device 101. The blades 491 in such a state are then used to cut (dice) the glass sheet 131, the resin layer 132, the sensor section 133, and the dicing sheet 181.

In an eighth step, the blades 491 are pulled out, thereby yielding the singulated imaging device 101 as illustrated in a third portion from the top of the right part of FIG. 11.

That is, as a result of the singulated imaging device 101 being yielded by cutting the grooves 131h along central lines thereof using the blades 491, opposite end portions of the grooves 131h are formed to be the tapered recess 111' in the end portion of the glass sheet 31 of the imaging device 101.

Furthermore, the black resin 471 is left as the grooves 131h in the recess 111', thereby forming a constituent element corresponding to the black resin section 411 in FIG. 10.

Thus, of the glass sheet 31, a range excluding the recess 111' is formed as the surface F101 including the film formation region. The surface F101 has substantially the same shape and substantially the same size as the opening 161 of the tray 151. To be exact, the surface F101 is slightly smaller than the opening 161.

In a ninth step, the recess 111' is abutted by the claw 162' with the surface F101 being the film formation region exposed from the opening 161' as illustrated in FIG. 10. The vapor deposition process is performed from below in FIG. 10, and thus the AR film 141 being an inorganic film is able to be formed over the entirety of the surface F101 being the film formation region.

Furthermore, the black resin section 411 (471) that spans the side surfaces of the imaging device 101 is formed on the recess 111' as illustrated in a lowermost portion of the right part of FIG. 11. Since the black resin section 411 absorbs incoming light and reflected light entering from the side surfaces, it is possible to reduce occurrence of ghost and flare.

6. Example of Application to Electronic Apparatus

The imaging device 101 in any of FIGS. 3, 5, 8, and 10 described above is applicable to various electronic apparatuses including, for example, imaging apparatuses such as digital still cameras and digital video cameras, mobile phones having an imaging function, and other apparatuses having an imaging function.

FIG. 12 is a block diagram illustrating a configuration example of an imaging apparatus being an electronic apparatus to which the present technology has been applied.

An imaging apparatus 501 illustrated in FIG. 12 includes an optical system 502, a shutter 503, a solid-state imaging device 504, a drive circuit 505, a signal processing circuit 506, a monitor 507, and memory 508. The imaging apparatus 501 is able to capture still images and moving images.

The optical system 502 includes one or more lenses and guides light from a subject (incident light) to the solid-state imaging device 504 to image the light on a light receiving plane of the solid-state imaging device 504.

The shutter 503 is disposed between the optical system 502 and the solid-state imaging device 504, and controls a light irradiation period and a light blocking period for light to the solid-state imaging device 504 in accordance with control of the drive circuit 1005.

The solid-state imaging device 504 is in a configuration of a package including the above-described solid-state imaging device. The solid-state imaging device 504 accumulates signal charge for a specific period of time depending on light to be imaged on the light receiving plane through the optical system 502 and the shutter 503. The signal charge accumulated by the solid-state imaging device 504 is transferred in accordance with a drive signal (timing signal) supplied from the drive circuit 505.

The drive circuit 505 outputs drive signals that control the transfer operation of the solid-state imaging device 504 and a shuttering operation of the shutter 503 to drive the solid-state imaging device 504 and the shutter 503.

The signal processing circuit 506 performs various types of signal processing on the signal charge outputted from the solid-state imaging device 504. An image (image data) obtained through the signal processing by the signal processing circuit 506 is supplied to the monitor 507 to be displayed thereon or supplied to the memory 508 to be stored (recorded) therein.

In the imaging apparatus 501 having such a configuration, the use of the imaging device 101 in any of FIGS. 3, 5, 8, and 10 instead of the optical system 502 and the solid-state imaging device 504 described above enables formation of an inorganic film over the entirety of the film formation region of the glass sheet in the imaging device. Furthermore, the use of the imaging device 101 in any of FIGS. 8 and 10 enables reduction of ghost and flare.

7. Usage Examples of Imaging Device

FIG. 13 is a diagram illustrating usage examples of the above-described imaging device 101.

The above-described imaging device 101 is for example usable in various cases such as described below in which light such as visible light, infrared light, ultraviolet light, and X-rays is sensed.

Apparatuses, such as a digital camera and a mobile apparatus having a camera function, that capture images for viewing Apparatuses for transportation applications, such as surveillance cameras that monitor running vehicles and roads, range-finding sensors for measuring a distance between vehicles or the like, and on-vehicle sensors that capture images of the view in front of, behind, around, or within a car for, for example, driver's condition recognition and safety driving by automatic stop and the like Apparatuses for home electrical appliances, such as TV, refrigerators, and air conditioners, for capturing images of user's gestures and operating the appliances in accordance with the gestures Apparatuses for medical care or healthcare applications, such as endoscopes and apparatuses that perform vascular imaging by receiving infrared light Apparatuses for security applications, such as surveillance cameras for crime prevention and cameras for human authentication Apparatuses for beauty care applications, such as skin measurement apparatuses that capture images of skin and microscopes that capture images of scalp Apparatuses for sports applications, such as action cameras and wearable cameras for usages in sports and the like Apparatuses for agricultural applications, such as cameras for monitoring conditions of agricultural fields and agricultural plants

8. Example of Application to Endoscopic Surgery System

The technology according to the present disclosure (present technology) is applicable to various products. For example, the technology according to the present disclosure may be applied to an endoscopic surgery system.

FIG. 14 is a view depicting an example of a schematic configuration of an endoscopic surgery system to which the technology according to an embodiment of the present disclosure (present technology) can be applied.

In FIG. 14, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 15 is a block diagram depicting an example of a functional configuration of the camera head 11102 and the CCU 11201 depicted in FIG. 14.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure is applicable has been described above. The technology according to the present disclosure is applicable to, for example, the endoscope 11100, (the image pickup unit 11402 of) the camera head 11102, (the image processing unit 11412 of) the CCU 11201, or the like, out of the components described above. Specifically, for example, the imaging device 101 in any of FIGS. 3, 5, 8, and 10 is applicable to the image pickup unit 10402. Applying the technology according to the present disclosure to the image pickup unit 10402 enables reliable formation of an inorganic film over the entirety of the film formation region of the glass sheet in the imaging device. Furthermore, apply the imaging device 101 in any of FIGS. 3, 5, 8, and 10 enables reduction of ghost and flare.

Note that although the endoscopic surgery system has been described as an example here, the technology according to the present disclosure may also be applied to, for example, a microscopic surgery system or the like.

9. Example of Application to Mobile Body

The technology according to the present disclosure (present technology) is applicable to various products. For example, the technology according to the present disclosure may be implemented as an apparatus mounted on any type of mobile body such as an automobile, an electric vehicle, a hybrid electric vehicle, a motorcycle, a bicycle, a personal mobility, an airplane, a drone, a vessel, or a robot.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (UF) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure is applicable has been described above. The technology according to the present disclosure is applicable to the imaging section 12031, for example, among the above-described components. Specifically, for example, the imaging device 101 in any of FIGS. 3, 5, 8, and 10 is applicable to the imaging section 12031. Applying the technology according to the present disclosure to the imaging section 12031 enables reliable formation of an inorganic film over the entirety of the film formation region of the glass sheet in the imaging device. Furthermore, applying the imaging device 101 in any of FIGS. 3, 5, 8, and 10 to the imaging section 12031 enables reduction of ghost and flare.

10. Configuration Examples of Stacked Solid-state Imaging Apparatus to Which Technique According to Present Disclosure is Applicable FIGS. 18A and 18B are diagrams illustrating an overview of configuration examples of a stacked solid-state imaging apparatus to which the technique according to the present disclosure is applicable.

FIG. 18A illustrates an example of a schematic configuration of a non-stacked solid-state imaging apparatus. A solid-state imaging apparatus 23010 includes a single die (semiconductor substrate) 23011 as illustrated in FIG. 18A. A pixel region 23012 including arrayed pixels, a control circuit 23013 that drives the pixels and performs various other types of control, and a logic circuit 23014 for signal processing are mounted in the die 23011.

FIGS. 18B and 18C illustrate examples of a schematic configuration of a stacked solid-state imaging apparatus. As illustrated in FIGS. 18B and 18C, a solid-state imaging apparatus 23020 includes two stacked dies, a sensor die 23021 and a logic die 23024, electrically coupled to each other and forming a single semiconductor chip.

In FIG. 18B, a pixel region 23012 and a control circuit 23013 are mounted in the sensor die 23021, and a logic circuit 23014 including a signal processing circuit that performs signal processing is mounted in the logic die 23024.

In FIG. 18C, the pixel region 23012 is mounted in the sensor die 23021, and the control circuit 23013 and the logic circuit 23014 are mounted in the logic die 23024.

FIG. 19 is a cross-sectional view illustrating a first configuration example of the stacked solid-state imaging apparatus 23020.

PD (photodiode) forming pixels that constitute the pixel region 23012, FD (floating diffusion), Tr (MOSFET), Tr that constitutes the control circuit 23013, and the like are formed in the sensor die 23021. Furthermore, a wiring layer 23101 including a plurality of layers, which in this example is three layers, of wiring lines 23110 is formed in the sensor die 23021. It should be noted that the control circuit 23013 (Tr that constitutes the control circuit 23013) may be included in the logic die 23024 instead of the sensor die 23021.

Tr that constitutes the logic circuit 23014 is formed in the logic die 23024. Furthermore, a wiring layer 23161 including a plurality of layers, which in this example is three layers, of wiring lines 23170 is formed in the logic die 23024. A contact hole 23171 having an insulating film 23172 formed on an inner wall surface thereof is formed in the logic die 23024, and a connection conductor 23173 to be coupled to the wiring lines 23170 and the like is embedded in the contact hole 23171.

The sensor die 23021 and the logic die 23024 are bonded together with their wiring layers 23101 and 23161 facing toward each other, forming the stacked solid-state imaging apparatus 23020 in which the sensor die 23021 and the logic die 23024 are stacked. A film 23191 such as a protective film is formed on a bonding plane between the sensor die 23021 and the logic die 23024.

A contact hole 23111 is formed in the sensor die 23021. The contact hole 23111 penetrates the sensor die 23021 from a back surface side (side where light enters the PD) (upper side) of the sensor die 23021 and reaches the uppermost layer of wiring line 23170 of the logic die 23024. Furthermore, a contact hole 23121 is formed in the sensor die 23021. The contact hole 23121 is located close to the contact hole 23111 and reaches the first layer of wiring line 23110 from the back surface side of the sensor die 23021. An insulating film 23112 is formed on an inner wall surface of the contact hole 23111, and an insulating film 23122 is formed on an inner wall surface of the contact hole 23121. Connection conductors 23113 and 23123 are respectively embedded in the contact holes 23111 and 23121. The connection conductors 23113 and 23123 are electrically coupled together on the back surface side of the sensor die 23021, and thus the sensor die 23021 and the logic die 23024 are electrically coupled together via the wiring layer 23101, the contact hole 23121, the contact hole 23111, and the wiring layer 23161.

FIG. 20 is a cross-sectional view illustrating a second configuration example of the stacked solid-state imaging apparatus 23020.

According to the second configuration example of the solid-state imaging apparatus 23020, a single contact hole 23211 formed in the sensor die 23021 electrically couples the sensor die 23021 (the wiring layer 23101 of the sensor die 23021 (the wiring lines 23110 of the wiring layer 23101)) and the logic die 23024 (the wiring layer 23161 of the logic die 23024 (the wiring lines 23170 of the wiring layer 23161)) together.

That is, the contact hole 23211 in FIG. 20 penetrates the sensor die 23021 from the back surface side of the sensor die 23021 and reaches the uppermost layer of wiring line 23170 of the logic die 23024 and also reaches the uppermost layer of wiring line 23110 of the sensor die 23021. An insulating film 23212 is formed on an inner wall surface of the contact hole 23211, and a connection conductor 23213 is embedded in the contact hole 23211. While the sensor die 23021 and the logic die 23024 in FIG. 19 described above are electrically coupled together by the two contact holes 23111 and 23121, the sensor die 23021 and the logic die 23024 in FIG. 20 are electrically coupled together by the single contact hole 23211.

FIG. 21 is a cross-sectional view illustrating a third configuration example of the stacked solid-state imaging apparatus 23020.

The solid-state imaging apparatus 23020 in FIG. 21 is different from the solid-state imaging apparatus 23020 in FIG. 19 in that the former does not have the film 23191 such as a protective film formed on the bonding plane between the sensor die 23021 and the logic die 23024 but the latter has the film 23191 such as a protective film formed on the bonding plane between the sensor die 23021 and the logic die 23024.

The solid-state imaging apparatus 23020 in FIG. 21 is formed by stacking the sensor die 23021 and the logic die 23024 such that the wiring lines 23110 and 23170 are in direct contact with each other, and applying desired load and heat thereto to directly bond the wiring lines 23110 and 23170 together.

FIG. 22 is a cross-sectional view illustrating another configuration example of the stacked solid-state imaging apparatus to which the technique according to the present disclosure is applicable.

A solid-state imaging apparatus 23401 in FIG. 22 has a three-layer stacked structure including three stacked dies: a sensor die 23411, a logic die 23412, and a memory die 23413.

The memory die 23413 for example includes a memory circuit that performs storage of data temporarily necessary in signal processing being performed in the logic die 23412.

In FIG. 22, the logic die 23412 and the memory die 23413 are arranged under the sensor die 23411 into a stack in the stated order, but the logic die 23412 and the memory die 23413 may be arranged under the sensor die 23411 into a stack in the inverse order, which in other words is an order of the memory die 23413 and the logic die 23412.

It should be noted that PD constituting a photoelectric conversion section of each pixel and source/drain regions of each pixel Tr are formed in the sensor die 23411 in FIG. 22.

A gate electrode is formed around the PD with a gate insulator therebetween, and the gate electrode and the paired source/drain regions form each of a pixel Tr 23421 and a pixel Tr 23422.

The pixel Tr 23421 adjacent to the PD is transfer Tr, and one of the paired source/drain regions forming the pixel Tr 23421 constitutes FD.

Furthermore, an inter-layer insulating film is formed in the sensor die 23411, and contact holes are formed in the inter-layer insulating film. Connection conductors 23431 are formed in the respective contact holes and coupled to the pixel Tr 23421 and the pixel Tr 23422.

Furthermore, a wiring layer 23433 including a plurality of layers of wiring lines 23432 coupled to each of the connection conductors 23431 is formed in the sensor die 23411.

Furthermore, an aluminum pad 23434 that serves as an electrode for external connection is formed in the lowermost layer of the wiring layer 23433 in the sensor die 23411. That is, the aluminum pad 23434 in the sensor die 23411 is located closer to a bonding plane 23440 between the sensor die 23411 and the logic die 23412 than the wiring lines 23432. The aluminum pad 23434 is used as one end of a wiring line for input and output of signals to and from the outside.

Furthermore, in the sensor die 23411, a contact 23441 is formed, which is used for electrical coupling of the sensor die 23411 to the logic die 23412. The contact 23441 is coupled to a contact 23451 in the logic die 23412 and is also coupled to an aluminum pad 23442 in the sensor die 23411.

Furthermore, in the sensor die 23411, a pad hole 23443 is formed, which reaches the aluminum pad 23442 from a back surface side (upper side) of the sensor die 23411.

The technique according to the present disclosure is applicable to solid-state imaging apparatuses such as described above.

It should be noted that the present disclosure may have the following configurations.

<1>
An Imaging Device Including:
an image sensor that captures an image; and
a glass sheet disposed on the image sensor, the glass sheet having a peripheral portion provided with a recess.

<2>
The imaging device according to <1>, in which the peripheral portion provided with the recess is located outside a film formation region of the glass sheet, the film formation region being a region over which an inorganic film is to be formed.

<3>
The imaging device according to <1> or <2>, in which the recess is in a shape corresponding to a claw on a periphery of an opening provided in a tray for formation of an inorganic film on the glass sheet.

<4>
The imaging device according to any one of <1> to <3>, in which the recess is in a step-like shape.

<5>
The imaging device according to any one of <1> to <3>, in which the recess is tapered and is in a flat surface shape.

<6>
The imaging device according to any one of <1> to <3>, in which the recess is in a curved surface shape.

<7>
The imaging device according to any one of <1> to <6>, in which the recess has a surface provided with a light-absorbing black resin section.

<8>
The imaging device according to any one of <1> to <7>, in which an inorganic film is formed on the glass sheet.

<9>
The imaging device according to <8>, in which the inorganic film is an AR (Anti Reflection) film or an IRCF (Infra-Red Cut Filter) film.

<10>
An Imaging Apparatus Including:
an image sensor that captures an image; and
a glass sheet disposed on the image sensor, the glass sheet having a peripheral portion provided with a recess.

<11>
An Electronic Apparatus Including:
an image sensor that captures an image; and
a glass sheet disposed on the image sensor, the glass sheet having a peripheral portion provided with a recess.

<12>
A method of producing an imaging device,
the imaging device including
an image sensor that captures an image, and
a glass sheet disposed on the image sensor, the glass sheet having a peripheral portion provided with a recess,
the method including:
a first step of forming first grooves in an undiced imaging device along central lines of dicing lines using first blades having a predetermined width; and
a second step of dicing the undiced imaging device along the central lines of the dicing lines using second blades having a width smaller than the predetermined width.

<13>
The method of producing the imaging device according to <12>, in which the first blades are V-shaped blades.

<14>
The method of producing the imaging device according to <12>, further including:
a third step of forming second grooves in the undiced imaging device along the central lines of the dicing lines using third blades after the first step, the second grooves having a larger depth than the first grooves, the third blades having a width smaller than the predetermined width of the first blades and larger than the width of the second blades;
a fourth step of filling the second grooves with a black resin; and
a fifth step of forming third grooves in the undiced imaging device along the central lines of the dicing lines using fourth blades, the third grooves having a smaller depth than the first grooves, the fourth blades having a width smaller than the width of the first blades and larger than the width of the third blades, in which
after the fifth step, the second step is performed to dice the undiced imaging device along the central lines of the dicing lines using the second blades.

<15>
The method of producing the imaging device according to <14>, in which the first blades and the fourth blades are same V-shaped blades, and the first blades and the fourth blades are different in depth of grooves to form.

<16>
The method of producing the imaging device according to <14>, further including a sixth step of forming an inorganic film on the glass sheet after the second step.

<17>
The method of producing the imaging device according to <16>, in which the inorganic film is an AR (Anti Reflection) film or an IRCF (Infra-Red Cut Filter) film.

REFERENCE SIGNS LIST

101: Imaging device
111: Recess
111': Recess
131: Glass sheet
131*a* to 131*h*: Groove
132: Resin layer
133: Sensor section
141: AR Film
151: Tray
161: Opening 162, 162': Claw
181: Dicing sheet
201, 211, 231, 241: Blade
321: Black resin section
331, 341, 351: Blade
371: Black resin
381, 391: Blade
411: Black resin section
421: V-shaped blade
431: Blade
451: Groove
471: Black resin
491: Blade

The invention claimed is:

1. An imaging device, comprising:
an image sensor configured to capture an image;
a glass sheet on the image sensor, wherein
the glass sheet includes a peripheral portion and a film formation region, and
the peripheral portion includes a recess and is outside the film formation region; and
an inorganic film on the recess and the film formation region.

2. The imaging device according to claim 1, wherein a shape of the recess corresponds to a claw on a periphery of an opening in a tray for formation of the inorganic film on the glass sheet.

3. The imaging device according to claim 1, wherein the recess has a step-like shape.

4. The imaging device according to claim 1, wherein the recess is tapered and has a flat surface.

5. The imaging device according to claim 1, wherein the recess has a curved surface.

6. The imaging device according to claim 1, wherein the inorganic film is on the glass sheet.

7. The imaging device according to claim 6, wherein the inorganic film is one of an AR (Anti Reflection) film or an IRCF (Infra-Red Cut Filter) film.

8. An imaging apparatus, comprising:
an image sensor configured to capture an image;
a glass sheet on the image sensor, wherein
the glass sheet includes a peripheral portion and a film formation region, and
the peripheral portion includes a recess and is outside the film formation region; and
an inorganic film on the recess and the film formation region.

9. An electronic apparatus, comprising:
an image sensor configured to capture an image;
a glass sheet on the image sensor, wherein
the glass sheet includes a peripheral portion and a film formation region, and
the peripheral portion includes a recess and is outside the film formation region; and
an inorganic film on the recess and the film formation region.

10. A method of producing an imaging device, the method comprising:
attaching an image sensor with an undiced glass sheet to a dicing sheet;
forming first grooves in the undiced glass sheet along central lines of dicing lines using first blades having a specific width;
dicing the undiced glass sheet along the central lines of the dicing lines using second blades having a width smaller than the specific width, wherein
the undiced glass sheet includes a peripheral portion and a film formation region, and
the peripheral portion includes a recess and is outside the film formation region; and
forming an inorganic film on the recess and the film formation region.

11. The method of producing the imaging device according to claim 10, wherein the first blades are V-shaped blades.

12. The method of producing the imaging device according to claim 10, further comprising:
forming second grooves in the undiced glass sheet along the central lines of the dicing lines using third blades, wherein
the second grooves have a larger depth than the first grooves, and
the third blades have a width smaller than the specific width of the first blades and larger than the width of the second blades; and
forming third grooves in the undiced glass sheet along the central lines of the dicing lines using fourth blades, wherein
the third grooves have a smaller depth than the first grooves, and
the fourth blades have a width smaller than the width of the first blades and larger than the width of the third blades; and
dicing the undiced glass sheet along the central lines of the dicing lines using the second blades.

13. The method of producing the imaging device according to claim 12, wherein the first blades and the fourth blades are same V-shaped blades, and the first blades and the fourth blades are different in depth of grooves to form.

14. The method of producing the imaging device according to claim 10, wherein the inorganic film is one of an AR (Anti Reflection) film or an IRCF (Infra-Red Cut Filter) film.

* * * * *